(12) United States Patent
Zheng

(10) Patent No.: US 9,070,875 B2
(45) Date of Patent: Jun. 30, 2015

(54) LOW TEMPERATURE GST PROCESS

(71) Applicant: Advanced Technology Materials, Inc., Danbury, CT (US)

(72) Inventor: Jun-Fei Zheng, Westport, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 14/104,984

(22) Filed: Dec. 12, 2013

(65) Prior Publication Data

US 2014/0106549 A1    Apr. 17, 2014

Related U.S. Application Data

(63) Continuation of application No. 13/321,810, filed as application No. PCT/US2010/035851 on May 21, 2010, now Pat. No. 8,617,972.

(60) Provisional application No. 61/180,518, filed on May
(Continued)

(51) Int. Cl.
*H01L 21/20* (2006.01)
*H01L 45/00* (2006.01)
(Continued)

(52) U.S. Cl.
CPC ............ *H01L 45/144* (2013.01); *C23C 16/305* (2013.01); *C23C 16/452* (2013.01); *C23C 16/45512* (2013.01); *C23C 16/45565* (2013.01);
(Continued)

(58) Field of Classification Search
USPC ........................................................ 438/483
See application file for complete search history.

(56) References Cited

U.S. PATENT DOCUMENTS 4,960,916 A    10/1990  Pazik
5,312,983 A    5/1994   Brown et al.
(Continued)

FOREIGN PATENT DOCUMENTS

EP    1675194 A2    6/2006
EP    1806427 A2    7/2007
(Continued)

OTHER PUBLICATIONS

Ritch, J., et al., "The single molecular precursor approach to metal telluride thin films: imino-bis (diisopropylphosphine tellurides) as examples", "Chem. Soc. Rev.", Jun. 27, 2007, pp. 1622-1631, vol. 36.
(Continued)

*Primary Examiner* — Marvin Payen
(74) *Attorney, Agent, or Firm* — Hultquist, PLLC; Steven J. Hultquist; Maggie Chappuis

(57) ABSTRACT

A deposition process to form a conformal phase change material film on the surface of a substrate to produce a memory device wafer comprises providing a substrate to a chamber of a deposition system; providing an activation region; introducing one or more precursors into the chamber upstream of the substrate; optionally introducing one or more co-reactants upstream of the substrate; activating the one or more precursors; heating the substrate; and depositing the phase change material film on the substrate from the one or more precursors by chemical vapor deposition. The deposited phase change material film comprises $Ge_xSb_yTe_zA_m$ in which A is a dopant selected from the group of N, C, In, Sn, and Se. In one implementation, the process is carried out to form GST films doped with carbon and nitrogen, to impart beneficial film growth and performance properties to the film.

7 Claims, 20 Drawing Sheets

Related U.S. Application Data 22, 2009, provisional application No. 61/223,225, filed on Jul. 6, 2009, provisional application No. 61/263,089, filed on Nov. 20, 2009, provisional application No. 61/317,819, filed on Mar. 26, 2010.

(51) Int. Cl.
*C23C 16/30* (2006.01)
*C23C 16/452* (2006.01)
*C23C 16/455* (2006.01)

(52) U.S. Cl.
CPC .......... *C23C 16/45574* (2013.01); *H01L 45/06* (2013.01); *H01L 45/1616* (2013.01)

(56) References Cited

U.S. PATENT DOCUMENTS

| | | |
|---|---|---|
| 5,596,522 A | 1/1997 | Ovshinsky et al. |
| 5,653,806 A | 8/1997 | Van Buskirk |
| 6,005,127 A | 12/1999 | Todd et al. |
| 6,146,608 A | 11/2000 | Todd et al. |
| 6,281,022 B1 | 8/2001 | Li et al. |
| 6,319,565 B1 | 11/2001 | Todd et al. |
| 6,511,718 B1 | 1/2003 | Paz de Araujo et al. |
| 6,750,079 B2 | 6/2004 | Lowrey et al. |
| 6,872,963 B2 | 3/2005 | Kostylev et al. |
| 6,984,591 B1 | 1/2006 | Buchanan et al. |
| 6,998,289 B2 | 2/2006 | Hudgens et al. |
| 7,029,978 B2 | 4/2006 | Dodge |
| 7,087,482 B2 | 8/2006 | Yeo et al. |
| 7,114,517 B2 | 10/2006 | Sund et al. |
| 7,115,927 B2 | 10/2006 | Hideki et al. |
| 7,312,165 B2 | 12/2007 | Jursich et al. |
| 7,371,429 B2 | 5/2008 | Lee et al. |
| 7,397,060 B2 | 7/2008 | Lung |
| 7,402,851 B2 | 7/2008 | Hideki et al. |
| 7,425,735 B2 | 9/2008 | Park et al. |
| 7,462,900 B2 | 12/2008 | Hideki et al. |
| 7,476,917 B2 | 1/2009 | Hideki et al. |
| 7,488,967 B2 | 2/2009 | Burr et al. |
| 7,569,417 B2 | 8/2009 | Lee et al. |
| 7,615,401 B2 | 11/2009 | Park et al. |
| 7,704,787 B2 | 4/2010 | Hideki et al. |
| 7,728,172 B2 | 6/2010 | Lee et al. |
| 7,838,329 B2 | 11/2010 | Hunks et al. |
| 7,943,502 B2 | 5/2011 | Park et al. |
| 8,008,117 B2 | 8/2011 | Hunks et al. |
| 8,272,347 B2 | 9/2012 | Nasman et al. |
| 8,617,972 B2 | 12/2013 | Zheng |
| 2004/0012009 A1 | 1/2004 | Casagrande et al. |
| 2004/0197945 A1 | 10/2004 | Woelk et al. |
| 2004/0215030 A1 | 10/2004 | Norman |
| 2005/0029502 A1 | 2/2005 | Hudgens |
| 2005/0082624 A1 | 4/2005 | Gousev et al. |
| 2005/0208699 A1 | 9/2005 | Furkay et al. |
| 2005/0267345 A1 | 12/2005 | Korgel et al. |
| 2005/0287747 A1 | 12/2005 | Chakravarti et al. |
| 2006/0027451 A1 | 2/2006 | Park et al. |
| 2006/0035462 A1 | 2/2006 | Millward |
| 2006/0040485 A1 | 2/2006 | Lee et al. |
| 2006/0049447 A1 | 3/2006 | Lee et al. |
| 2006/0138393 A1 | 6/2006 | Seo et al. |
| 2006/0141710 A1 | 6/2006 | Yoon et al. |
| 2006/0172067 A1 | 8/2006 | Ovshinsky et al. |
| 2006/0172083 A1 | 8/2006 | Lee et al. |
| 2006/0180811 A1 | 8/2006 | Lee et al. |
| 2007/0090336 A1 | 4/2007 | Asano et al. |
| 2007/0121363 A1 | 5/2007 | Lung |
| 2007/0154637 A1 | 7/2007 | Shenai-Khatkhate et al. |
| 2007/0160760 A1 | 7/2007 | Shin et al. |
| 2007/0246748 A1 | 10/2007 | Breitwisch et al. |
| 2008/0017841 A1 | 1/2008 | Lee et al. |
| 2008/0035906 A1 | 2/2008 | Park et al. |
| 2008/0035961 A1 | 2/2008 | Chen et al. |
| 2008/0078984 A1 | 4/2008 | Park et al. |
| 2008/0096386 A1 | 4/2008 | Park et al. |
| 2008/0118636 A1 | 5/2008 | Shin et al. |
| 2008/0210163 A1 | 9/2008 | Carlson et al. |
| 2008/0254218 A1 | 10/2008 | Lei et al. |
| 2008/0290335 A1 | 11/2008 | Lin et al. |
| 2009/0020738 A1 | 1/2009 | Happ et al. |
| 2009/0075420 A1 | 3/2009 | Bae et al. |
| 2009/0087561 A1 | 4/2009 | Chen et al. |
| 2009/0097305 A1 | 4/2009 | Bae et al. |
| 2009/0101883 A1 | 4/2009 | Lai et al. |
| 2009/0112009 A1* | 4/2009 | Chen et al. ...................... 556/12 |
| 2009/0124039 A1 | 5/2009 | Roeder et al. |
| 2009/0215225 A1 | 8/2009 | Stender et al. |
| 2009/0227066 A1 | 9/2009 | Joseph et al. |
| 2009/0275164 A1 | 11/2009 | Chen et al. |
| 2009/0291208 A1 | 11/2009 | Gordon et al. |
| 2009/0305458 A1 | 12/2009 | Hunks et al. |
| 2009/0321733 A1 | 12/2009 | Gatineau et al. |
| 2010/0012917 A1 | 1/2010 | Takaura et al. |
| 2010/0018439 A1 | 1/2010 | Cameron et al. |
| 2010/0190341 A1 | 7/2010 | Park et al. |
| 2010/0270527 A1 | 10/2010 | Sawamura |
| 2010/0317150 A1 | 12/2010 | Hunks et al. |
| 2011/0001107 A1 | 1/2011 | Zheng |
| 2011/0065252 A1 | 3/2011 | Nakamura |
| 2011/0111556 A1 | 5/2011 | Chen et al. |
| 2011/0124182 A1 | 5/2011 | Zheng |
| 2011/0263100 A1 | 10/2011 | Hunks et al. |

FOREIGN PATENT DOCUMENTS

| | | |
|---|---|---|
| JP | 5-311423 A | 11/1993 |
| JP | 2001-67720 A | 3/2001 |
| JP | 2002-211924 A | 7/2002 |
| JP | 2002-220658 A | 8/2002 |
| JP | 2006-124262 A | 5/2006 |
| JP | 2006-182781 A | 7/2006 |
| KR | 10-2005-0048891 A | 5/2005 |
| KR | 10-2006-0091160 A | 8/2006 |
| KR | 10-2007-0025612 A | 3/2007 |
| KR | 10-2007-0105752 A | 10/2007 |
| KR | 10-2008-0052362 A | 6/2008 |
| KR | 10-2009-0008799 A | 1/2009 |
| KR | 10-2009-0029488 A | 3/2009 |
| KR | 10-2009-0036771 A | 4/2009 |
| KR | 10-2009-0045132 A | 5/2009 |
| TW | 200625543 A | 7/2006 |
| TW | 200822356 A | 5/2008 |
| WO | 2004046417 A2 | 6/2004 |
| WO | 2005084231 A2 | 9/2005 |
| WO | 2006012052 A2 | 2/2006 |
| WO | 2007070218 A2 | 6/2007 |
| WO | 2008057616 A2 | 5/2008 |
| WO | 2009034775 A1 | 3/2009 |
| WO | 2011002705 A2 | 1/2011 |

OTHER PUBLICATIONS

Schlecht, S., et al., "Direct Synthesis of (PhSe)4Ge and (PhTe)4Ge from Activated Hydrogenated Germanium-Crystal Structure and Twinning of (PhTe)4Ge", "Eur. J. Inorg. Chem.", 2003, pp. 1411-1415.

Stauf, G., et al., "Low Temperature ALD of Germanium for Phase Change Memory Thin Films", "AVS 7th International Conference on Atomic Layer Deposition—ALD 2007", Jun. 24, 2007, pp. 1-8.

Steigerwald, M., et al., "Organometallic Synthesis of II-VI Semiconductors. 1. Formation and Decomposition of Bis(organotelluro)mercury and Bis(organotelluro)cadmium Compounds", "J. Am. Chem. Soc.", 1987, pp. 7200-7201, vol. 109.

Tsumuraya, T., et al., "Telluradigermiranes. A Novel Three-membered Ring System Containing Tellurium", "J. Chem. Soc. Chem. Commun.", 1990, pp. 1159-1160.

Abrutis, A., et al., "Hot-Wire Chemical Vapor Deposition of Chalcogenide Materials for Phase Change Memory Applications", "Chem. Mater.", May 2008, pp. 3557-3559, vol. 20, No. 11.

(56) References Cited

OTHER PUBLICATIONS

Allen, F., et al., "Tables of Bond Lengths Determined by X-ray and Neutron Diffraction. Part 1. Bond Lengths in Organic Compounds", "J. Chem. Soc. Perkin Tran. II", 1987, pp. S1-S19.

Auner, N., et al., "Organosilicon Chemistry IV: From Molecules to Materials", Mar. 2000, p. 291 (Abstract), Publisher: Wiley-Vch.

Cheng, H., et al., "Wet Etching of GE2SB2TE5 Films and Switching Properties of Resultant Phase Change Memory Cells", "Semiconductor Science and Technology", Sep. 26, 2005, pp. 1111-1115, vol. 20, No. 11.

Choi, B., et al., "Combined Atomic Layer and Chemical Vapor Deposition, and Selective Growth of Ge2Sb2Te5 Films on TiN/W Contact Plug", "Chem. Mater.", Aug. 14, 2007, pp. 4387-4389, vol. 19.

Choi, B., et al., "Cyclic PECVD of Ge2Sb2Te5 Films Using Metal-lorganic Sources", "Journal of the Electrochemical Society", Feb. 22, 2007, pp. H318-H324, vol. 154, No. 4.

Chorley, R., et al., "Subvalent Group 14 metal compounds XIV. The X-ray crystal structures of two monomeric Group 14 metal bisamides, Ge[N(SiMe3)2]2 and Sn[NC(Me)2(CH2)3CMe2]2", "Inorganica Chimica Acta", Aug.-Oct. 1992, pp. 203-209, vol. 198-200.

Cole-Hamilton, D., "MOVPE Mechanisms from studies of specially designed and labelled precursors", "Chem. Commun.", 1999, pp. 759-765.

Green, S., et al., "Synthetic, structural and theoretical studies of amidinate and guanidinate stabilised germanium(I) dimers", "Chem. Commun.", Sep. 8, 2006, pp. 3978-3980.

Horii, H., et al., "A Novel Cell Technology Using N-Doped GeSbTe Films for Phase Change RAM", "Symposium on VLSI Technology Digest of Technical Papers", Jun. 10-12, 2003, pp. 177-178.

Hudgens, S., et al., "Overview of Phase Change Chalcogenide Nonvolatile Memory Technology", "MRS Bulletin", Nov. 2004, pp. 1-5.

Karsch, H., et al., "Bis(amidinate) Complexes of Silicon and Germanium", "Eur. J. Inorg. Chemistry", Apr. 1998, pp. 433-436, vol. 4.

Kim, R., et al., "Structural Properties of Ge2Sb2Te5 thin films by metal organic chemical vapor deposition for phase change memory applications", "Applied Physics Letters", Sep. 6, 2006, pp. 1-3, vol. 89, No. 102107.

Kim, S., et al., "Electrical Properties and Crystal Structures of Nitrogen-Doped Ge2Sb2Te5 Thin Film for Phase Change Memory", "Thin Solid Films", Dec. 22, 2004, pp. 322-326, vol. 469-470.

Kuchta, M., et al., "Multiple Bonding Between Germanium and the Chalcogens: The Syntheses and Structures of the Terminal Chalogenido Complexes (n4-Me8taa)GeE (E=S, Se, Te)", "J. Chem. Soc. Chem. Commun.", 1994, pp. 1351-1352.

Lee, J., et al., "GeSbTe deposition for the PRAM application", "Applied Surface Science", Feb. 2007, pp. 3969-3976, vol. 253, No. 8.

Meller, A., et al., "Synthesis and Isolation of New Germanium(II) Compounds and of Free Germylenes", "Chem. Ber.", May 1985, pp. 2020-2029 (English Abstract), vol. 118, No. 5.

Ovshinsky, S., "Reversible Electrical Switching Phenomena in Disordered Structures", "Physical Review Letters", Nov. 11, 1968, pp. 1450-1455, vol. 21, No. 20.

Privitera, S., et al., "Phase change mechanisms in Ge2Sb2Te5", "Journal of Applied Physics", Jul. 9, 2007, pp. 1-5, vol. 102, No. 013516.

* cited by examiner

CONFORMAL GST DEPOSITION
THICKNESS AND COMPOSITION:
529A, 48.9% Ge, 8.5% Sb, 42.6% Te

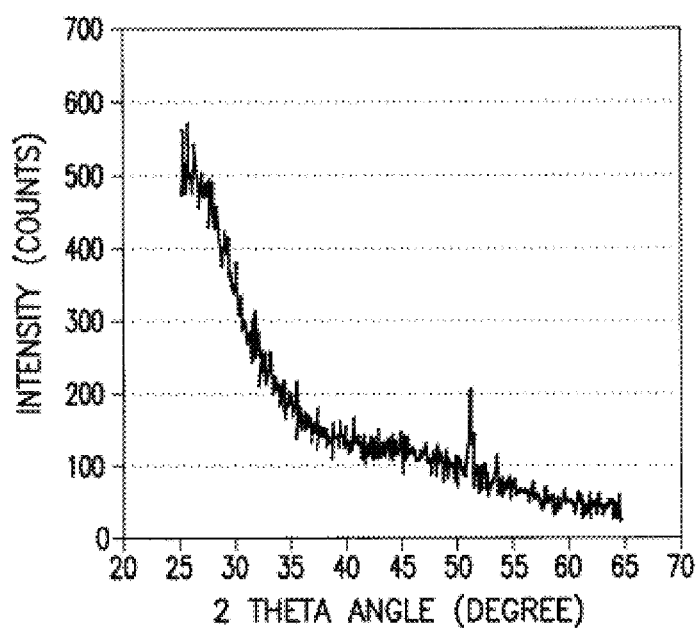
FIG.2b — XRD OF AN AMORPHOUS AS-DEPOSITED FILM WITH ~50% Te
SAMPLE WITH FOLLOWING COMPOSITION: 308.1Å, 44.8% Ge, 5.3% Sb, 49.8% Te CONFORMAL GST DEPOSITION
THICKNESS AND COMPOSITIONS:
385.4A, 14.1%Ge, 26.4%Sb, 52.6%Te, 6.97%N

LOW TEMPERATURE GST PROCESS

CROSS-REFERENCE TO RELATED APPLICATIONS

This application is a continuation under the provisions of 35 U.S.C. §120 of U.S. patent application Ser. No. 13/321,810 filed Nov. 21, 2011, and issued Dec. 31, 2013 as U.S. Pat. No. 8,617,972, which in turn is a U.S. national phase application under the provisions of 35 U.S.C. §371 of International Patent Application No. PCT/US10/035,851 filed May 21, 2010, which in turn claims the benefit of priority under the provisions of 35 U.S.C. §119 of each of the following patent applications: U.S. Provisional Patent Application No. 61/317,819 filed Mar. 26, 2010 in the name of Jun-Fei Zheng for "Low Temperature GST Process;" U.S. Provisional Patent Application No. 61/263,089 filed Nov. 20, 2009 in the name of Jun-Fei Zheng for "Low Temperature GST Process;" U.S. Provisional Patent Application No. 61/223,225 filed Jul. 6, 2009 in the name of Jun-Fei Zheng for "Low Temperature GST Process;" and U.S. Provisional Patent Application No. 61/180,518 filed May 22, 2009 in the name of Jun-Fei Zheng for "Low Temperature GST Process." The disclosures of such U.S. patent application Ser. No. 13/321,810, International Patent Application No. PCT/US10/035,851, and all of said U.S. Provisional Patent Applications are hereby incorporated herein by reference in their respective entireties, for all purposes.

TECHNICAL FIELD

The present invention relates generally to the processing of germanium antimony telluride materials and, more particularly, to the processing of germanium antimony telluride materials at low temperatures.

BACKGROUND

Materials such as germanium (Ge), antimony (Sb), and tellurium (Te) are often deposited onto substrates as phase change memory materials for use in semiconductor wafers or other semiconductor device structures. The conformal deposition of such materials in the forms of GST films is desirable for use in semiconductor device structures having high aspect ratio topographical features such as vias. The deposition is often effected using CVD (chemical vapor deposition) or other processes.

The processing and handling of Ge, Sb, and Te materials for applying the GST films using CVD normally occurs at substrate temperatures above about 300 degrees C. The reason for this is that typical precursors for CVD processes generally utilize such high temperatures to promote molecular reactivity. However, amorphous or partially amorphous GST films are desired to attain the conformal deposition of the films and thus the substrate process temperature is preferred to be below the GST crystallization temperature, which is generally less than about 300 degrees C. This is specifically true for (1) GST in which the composition is stoichiometric (% Ge+% Sb*1.5=% Te); (2) GST with low levels of impurities; and (3) GST for use in devices having technologically desirable fast speed operations.

Processes of these types for GST deposition using CVD techniques at temperatures below 300 degrees C. in order to obtain amorphous GST or close to amorphous GST (partial crystalline) have heretofore been unknown, especially for achieving high Te content. This is due to the fact that Te precursors (when Te is incorporated in a CVD process) are difficult to activate and only have suitable reactivity at temperatures typically higher than 300 degrees C. Currently, it has heretofore not been possible using conventional CVD techniques to process amorphous or partial amorphous GST having compositions in which Ge:Sb:Te is about 4:1:5 or 2:2:5 in which the Te is as high as 50% or 56%, respectively. In addition, because conventional CVD techniques utilize precursors in the deposition of the GST at processing temperatures of 300 degrees C. and above, the deposition of the GST film generally results in the crystallization of the film and thus is typically not conformal, particularly when the Te is present in amounts above about 45%.

SUMMARY

In one aspect, the present invention resides in a deposition process to form a phase change material film on the surface of a heated substrate, e.g., to produce a memory device wafer. The deposition process includes use of an activation region through which precursors pass before the deposit thereof onto the substrate surface. The activation region, with sufficient interaction of the precursors passing therethrough in the presence of heat, causes the activation of one or more of the precursors and/or one or more co-reactants. The activated precursor(s) and/or co-reactants are deposited onto the substrate as the phase change material film comprising $Ge_xSb_yTe_zA_m$, as hereinafter more fully described, thereby forming the memory device wafer.

In a further aspect, the present description resides in a deposition process to form a phase change material film on the surface of a substrate to produce a memory device wafer. The deposition process includes use of a first heating source to form an activation region in a process chamber. The substrate may also be heated by radiating heat from the first heating source, or by other heating methods such as directly contacting the substrate using a second heating source. The activation region is of sufficiently high temperature and provides suitable paths for one or more precursors and/or co-reactants or other gas species to pass through to interact and/or activate one or more of the precursors and/or co-reactants. The deposition process also includes depositing the phase change material as a film onto the substrate from the one or more precursors by vapor deposition methods. The deposited phase change material film comprises $Ge_xSb_yTe_zA_m$, in which A is one or more dopant species selected from the group consisting of N, C, In, Sn, and Se. The source of the elements N and C may be either the precursors of Ge, Sb, or Te, e.g., in organometallic precursors for such elements, in which the precursor includes a N- and/or C-containing moiety that serves to introduce nitrogen and/or carbon to the deposition for incorporation in the film being formed; alternatively, the source of the nitrogen and/or carbon can be additional precursors or added co-reactants. The nitrogen and/or carbon may be introduced to the deposition for incorporation in the film being formed, in a free form or in a bound, e.g., covalently bonded, form. As an example, the nitrogen component may be introduced to the deposition in free form, as nitrogen gas, or nitrogen can be introduced by addition of a nitrogenous component to the deposition, such as ammonia, urea, or other nitrogen-containing compound. The process chamber may be a deposition chamber in which the deposition is carried out or the process chamber may be a chamber that is separate from the deposition chamber. In some embodiments, the activation heating location and activation heating source are devoid of any hot wire heating elements.

In $Ge_xSb_yTe_zA_m$ films of the invention, x, y, z and m can have any suitable and compatible values. In various embodiments, x is about 0.1-0.6, y is about 0-0.7, z is about 0.2-0.9, and m is about 0-0.20. As mentioned, the dopant A can include more than one compatible dopant element from the group of dopant elements N, C, In, Sn, and Se, so that $A_m$ comprises multiple $A_m$ dopant elements. For example, the dopant elements can be carbon and nitrogen in the GST film, as respective $A_m^1$ and $A_m^2$ constituents of the aforementioned formula, wherein each of the $A_m^1$ and $A_m^2$ constituents is independently defined as to its amount in the GST alloy composition by m having a value of from 0 to 0.20.

One aspect of the disclosure relates to a deposition process to form a conformal phase change material film on the surface of a substrate to produce a memory device wafer, comprising:

providing a substrate to a chamber of a deposition system;

providing an activation region having a first heat source, wherein the activation region and the first heat source are located inside or outside of the chamber;

introducing one or more precursors into the chamber upstream of the substrate;

optionally introducing one or more co-reactants upstream of the substrate;

activating the one or more precursors by contacting the precursors with the first heat source;

heating the substrate using a second heat source;

depositing the phase change material film on the substrate from the one or more precursors by chemical vapor deposition;

wherein the deposited phase change material film comprises $Ge_xSb_yTe_zA_m$;

wherein A is a dopant selected from the group of dopant elements N, C, In, Sn, and Se;

wherein x is about 0.1-0.6, y is about 0-0.7, z is about 0.2-0.9, and m is about 0-0.15; and wherein the dopant A can include more than one compatible dopant element from said group, so that $A_m$ comprises multiple $A_m$ dopant elements.

A further aspect of the disclosure relates to a deposition process to form a conformal phase change material film on the surface of a substrate to produce a memory device wafer, comprising:

providing a substrate to a chamber of a deposition system;

introducing one or more precursors into the chamber upstream of the substrate;

optionally introducing one or more co-reactants upstream of the substrate;

heating the substrate to a temperature of about of 110 to 250 degrees C., depositing the phase change material film on the substrate from the one or more precursors by chemical vapor deposition;

wherein the deposited phase change material film comprises $Ge_xSb_yTe_zA_m$;

wherein A is a dopant selected from the group of dopant elements N, C, In, Sn, and Se;

wherein x is about 0.1-0.6, y is about 0-0.7, z is about 0.2-0.9, and m is about 0-0.20; and wherein the dopant A can include more than one compatible dopant element from said group, so that $A_m$ comprises multiple $A_m$ dopant elements.

Another aspect of the disclosure relates to a deposition system including a deposition chamber having multiple inlets for introduction of materials into the deposition chamber for contacting with a substrate positioned in a deposition portion of said deposition chamber, with the deposition system including a heat source arranged to heat the substrate to temperature enabling deposition of material thereon deriving from a precursor mixture comprising said materials, and such deposition system including a heating activation location selected from among (i) a heating activation portion of said deposition chamber, (ii) at least one of said multiple inlets, and (iii) a heating activation chamber upstream of and in flow communication with at least one of said multiple inlets, and a further heat source arranged to heat the heating activation location to temperature above temperature of said deposition portion of said deposition chamber.

In a further aspect, the disclosure relates to a deposition process for depositing material on a substrate, comprising heating the substrate to temperature enabling deposition of material thereon from a precursor mixture, and contacting the precursor mixture with the substrate to deposit material thereon, wherein the precursor mixture or one or more components thereof is subjected to heating prior to said contacting, to activate the precursor mixture or one or more components thereof, wherein said heating prior to said contacting is at higher temperature than temperature of the substrate when the substrate is heated, and said heating prior to such contacting is carried out in a portion of the deposition chamber upstream of the substrate, or in one or more inlets to said deposition chamber, or upstream of said deposition chamber, in a separate dedicated heating chamber.

A still further aspect of the disclosure relates to a vapor deposition system, comprising a deposition chamber containing multiple showerheads for delivery of multiple precursors into said chamber, wherein said multiple showerheads are arranged so that at least one but less than all showerheads is joined to a pre-activation zone arranged to heat precursor to an activation temperature for delivery of pre-activated precursor into said chamber.

Another aspect of the disclosure relates to a vapor deposition process, comprising delivery of multiple precursors into a deposition zone via multiple showerheads, wherein said multiple showerheads are arranged so that at least one but less than all showerheads is joined to a pre-activation zone arranged to heat precursor to an activation temperature for delivery of pre-activated precursor into said deposition zone.

In yet another aspect, the disclosure relates to a vapor deposition system, comprising a vapor deposition chamber having a showerhead therein, wherein the showerhead comprises a plate member extending laterally across a full cross-section section of the deposition chamber, generally perpendicular to vapor flow direction of precursor therein, wherein said plate member comprises vapor flow passages therethrough, and wherein the plate member is leak-tightly sealed at its periphery to interior surface of the vapor deposition chamber. In other embodiments, a plate or other member may be used as a distribution arrangement, in which the plate extends across less than the full width of the chamber.

A further aspect of the disclosure relates to a composite showerhead assembly, including a first showerhead enclosing a fluid mixing volume and outlet openings for discharge of mixed fluid therefrom, and at least feed passage for introducing fluid to the fluid mixing volume, said first showerhead being coupled with a second showerhead enclosing a second fluid mixing volume and flow passages providing second outlet openings for discharge of second mixed fluid therefrom, wherein said flow passages extend through and are leak-tightly sealed against the fluid mixing volume of the first showerhead.

In another aspect, the present disclosure relates to a vapor deposition film formation process, comprising thermally activating a tellurium precursor of the formula R—Te—R, wherein each R is independently selected from $C_1$-$C_4$ alkyl species, including methyl, ethyl, isopropyl, tertiary butyl, and trimethylsilyl to yield a corresponding ditelluride vapor of the formula R—Te—Te—R, and contacting the ditelluride vapor with a substrate to deposit a tellurium-containing film thereon.

In another aspect the disclosure relates to a conformal GST thin film having an atomic composition comprising from 0 to 50% Sb, from 50 to 80% Te, from 20 to 50% Ge, from 3 to 20% N and from 3 to 20% carbon, wherein all atomic percentages of all components (including components other than those specified here) of the film total to 100 atomic %.

In a further aspect the disclosure relates to a conformal GST thin film deposited using CVD, wherein the film has an atomic composition comprising from 10 to 50% Sb, from 50 to 80% Te, from 10 to 50% Ge, from 3 to 20% N and from 3 to 20% carbon, and wherein all atomic percentages of all components of the film total to 100 atomic %.

As used herein, the term "film" refers to a layer of deposited material having a thickness below 1000 micrometers, e.g., from such value down to atomic monolayer thickness values. In various embodiments, film thicknesses of deposited material layers in the practice of the invention may for example be below 100, 10, or 1 micrometers, or in various thin film regimes below 200, 100, or 50 nanometers, depending on the specific application involved. As used herein, the term "thin film" means a layer of a material having a thickness below 1 micrometer.

As used herein and in the appended claims, the singular forms "a", "and", and "the" include plural referents unless the context clearly dictates otherwise.

As used herein, the identification of a carbon number range, e.g., in $C_1$-$C_{12}$ alkyl, is intended to include each of the component carbon number moieties within such range, so that each intervening carbon number and any other stated or intervening carbon number value in that stated range, is encompassed, it being further understood that sub-ranges of carbon number within specified carbon number ranges may independently be included in smaller carbon number ranges, within the scope of the invention, and that ranges of carbon numbers specifically excluding a carbon number or numbers are included in the invention, and sub-ranges excluding either or both of carbon number limits of specified ranges are also included in the invention. Accordingly, $C_1$-$C_{12}$ alkyl is intended to include methyl, ethyl, propyl, butyl, pentyl, hexyl, heptyl, octyl, nonyl, decyl, undecyl and dodecyl, including straight chain as well as branched groups of such types. It therefore is to be appreciated that identification of a carbon number range, e.g., $C_1$-$C_{12}$, as broadly applicable to a substituent moiety, enables, in specific embodiments of the invention, the carbon number range to be further restricted, as a sub-group of moieties having a carbon number range within the broader specification of the substituent moiety. By way of example, the carbon number range e.g., $C_1$-$C_{12}$ alkyl, may be more restrictively specified, in particular embodiments of the invention, to encompass sub-ranges such as $C_1$-$C_4$ alkyl, $C_2$-$C_8$ alkyl, $C_2$-$C_4$ alkyl, $C_3$-$C_5$ alkyl, or any other sub-range within the broad carbon number range.

Other aspects, features and advantages of the disclosure will be more fully apparent from the ensuing description.

BRIEF DESCRIPTION OF DRAWINGS

FIG. 2b is an X-ray diffraction scan pattern of a GST film with a Ge:Sb:Te composition close to 4:1:5 and showing amorphous characteristics.

DETAILED DESCRIPTION

Figure 1:
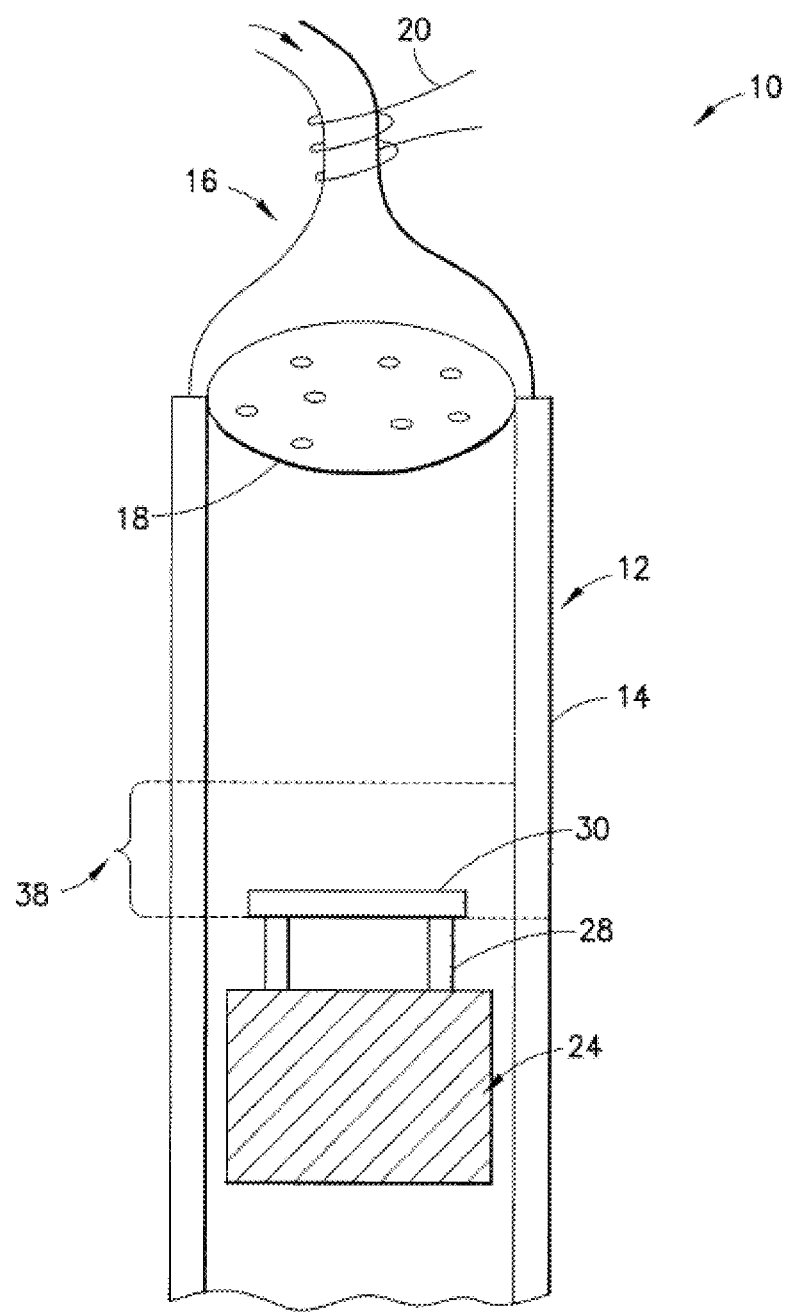
FIG. 1 is a schematic representation of a GST deposition process of the present invention.

All percentages expressed herein are atomic percentages.

Unless otherwise specified, all film compositions herein are specified in terms of atomic percentages of the film components, wherein the sum of all atomic percentages of all components in the film totals to 100 atomic %.

As used herein, the term CVD is defined as the deposition of a solid on a surface from a chemical precursor, and includes but is not limited to the following: Atmospheric pressure CVD (APCVD), Low pressure CVD (LPCVD), Ultrahigh vacuum CVD (UHVCVD), Aerosol-assisted CVD (AACVD), Digital CVD (DCVD), Direct liquid injection CVD (DLICVD), Microwave plasma-assisted CVD (MPCVD), Plasma-enhanced CVD (PECVD), Remote plasma-enhanced CVD (RPECVD), Atomic layer CVD (AL-CVD), Hot wire CVD (HWCVD), Metalorganic chemical vapor deposition (MOCVD), Hybrid physical-chemical vapor deposition (HPCVD), Rapid thermal CVD (RTCVD), and Vapor phase epitaxy (VPE).

The present disclosure relates in a primary aspect to chalcogenide materials having utility for manufacture of semiconductor materials, devices and device precursor structures.

The chalcogenide materials can for example include those selected from the group consisting of:

(i) material of the formula $Ge_xSb_yTe_zC_mN_n$
wherein:
x is about 0.1-0.6, y is about 0-0.7, z is about 0.2-0.9, m is about 0.02-0.20, and n is about 0.02-0.20;
(ii) material of the formula $Ge_xSb_yTe_zA_m$, wherein A is a dopant element selected from the group of N, C, In, Sn, and Se, and wherein x is from 0.1 to 0.6, y is from 0 to 0.7, z is from 0.2 to 0.9, and m is from 0 to 0.15;
(iii) material containing 27.5 to 33% germanium, with tellurium up to 55%, and the remainder being antimony;
(iv) 225 GeSbTe doped with germanium to yield germanium-rich GeSbTe material;
(v) germanium-enriched GeSbTe having a ratio of GeTe:$Sb_2Te_3$ that is in a range of from 3:1 to 10:1;
(vi) GeSbTe material containing 25 to 60% germanium, 8 to 25% antimony, and 40 to 55% tellurium; and
(vii) material selected from the group consisting of materials (ii)-(vi), as doped with at least one of carbon and nitrogen, wherein the amount of each is in a range of from 2 to 20%.

The material of the above-described type can include material in which $Ge_xSb_yTe$, therein has an atomic composition selected from the group consisting of:
(i) 22.5 at. % germanium, 22.5 at. % antimony and 55 at. % tellurium;
(ii) 27.5 to 32.5 at. % germanium and from 50 to 55 at. % tellurium;
(iii) 27 to 33% germanium, from 14 to 23% antimony and from 50 to 55% tellurium;
(iv) 27.2% germanium, 18.2% antimony and 54.5% tellurium;
(v) 30.7% germanium, 15.4% antimony, and 53.9% tellurium;
(vi) 33.3% germanium, 13.3% antimony and 53.3% tellurium;
(vii) 35.3% germanium, 11.8% antimony and 52.9% tellurium;
(viii) 36% germanium, 14% antimony and 50% tellurium;
(ix) 40% germanium, 8% antimony and 52% tellurium;
(x)) 40% germanium, 5% antimony and 55% tellurium;
(xi) 30% germanium, 19% antimony and 51% tellurium;
(xii) 30% germanium, 16% antimony and 54% tellurium; and
(xiii) 32% germanium, 14% antimony and 54% tellurium.

GST materials of the present disclosures can be doped, e.g., with carbon and/or nitrogen. In various embodiments, the material is doped with carbon at 2 to 20 at. %, or at 3 to 20 at. %, or at 2 to 15 at. %, or at 2 to 10 at. %, or at 3 to 10 at. %, or at 2 to 6 at. %. Likewise, the material can be doped with nitrogen at 2 to 20 at. %, or at 3 to 20 at. %, or at 3 to 15 at. %, or at 3 to 12 at. %, or at 3 to 10 at. %, or at 5 to 10 at. %. The specific dopant levels can be readily determined within the skill of the art, based on the present disclosure, by conducting doping at varying levels and characterizing the resulting films as to their characteristics and performance qualities.

The disclosure in one aspect relates to a deposition process to form a conformal phase change material film on the surface of a substrate to produce a memory device wafer, comprising:
providing a substrate to a chamber of a deposition system;
providing an activation region having a first heat source, wherein the activation region and the first heat source are located inside or outside of the chamber;
introducing one or more precursors into the chamber upstream of the substrate;
optionally introducing one or more co-reactants upstream of the substrate;
activating the one or more precursors by contacting the precursors with the first heat source;
heating the substrate using a second heat source;
depositing the phase change material film on the substrate from the one or more precursors by chemical vapor deposition;
wherein the deposited phase change material film comprises $Ge_xSb_yTe_zA_m$;
wherein A is a dopant selected from the group of dopant elements N, C, In, Sn, and Se;
wherein x is about 0.1-0.6, y is about 0-0.7, z is about 0.2-0.9, and m is about 0-0.20; and
wherein the dopant A can include more than one compatible dopant element from said group, so that $A_m$ comprises multiple $A_m$ dopant elements In another aspect, the disclosure relates to a deposition process to form a conformal phase change material film on the surface of a substrate to produce a memory device wafer, comprising:
providing a substrate to a chamber of a deposition system;
introducing one or more precursors into the chamber upstream of the substrate;
optionally introducing one or more co-reactants upstream of the substrate;
heating the substrate to a temperature of about of 110 to 250 degrees C.,
depositing the phase change material film on the substrate from the one or more precursors by chemical vapor deposition;
wherein the deposited phase change material film comprises $Ge_xSb_yTe_zA_m$;
wherein A is a dopant selected from the group of dopant elements N, C, In, Sn, and Se;
wherein x is about 0.1-0.6, y is about 0-0.7, z is about 0.2-0.9, and m is about 0-0.20; and
wherein the dopant A can include more than one compatible dopant element from said group, so that $A_m$ comprises multiple $A_m$ dopant elements.

The deposition process of the present disclosure can be conducted so that the carbon and/or nitrogen incorporation in the deposited chalcogenide is at a desired level, e.g., wherein either or both of such components is present in the material each in an amount of up to 20 at. %. In some embodiments, the amount of each of such species when it is present is from 0.05 to 20 at. %. In other embodiments, each independently is present in an amount of from 2 to 20%, or from 3 to 20%, or from 3 to 15%, or from 5 to 15% or from 5 to 10%. Preferably, each of carbon and nitrogen is present in an amount of at least 3% and not more than 15%.

In one embodiment of the present invention as shown in FIG. 1, a system for producing and depositing low temperature GST materials is generally designated by the reference number 10 and hereinafter referred to as "system 10." In the process of using system 10, GST materials comprising reactants are deposited onto a substrate (hereinafter referred to as "wafer") as a film to form a phase change material (PCM) device.

The system 10 comprises a deposition chamber 12 or furnace defined by at least one wall 14. However, the present invention is not limited in this regard, as other configurations are possible. The inner surface of the wall of the deposition chamber 12 defines a heat shield 14. An inlet 16 is located in the deposition chamber 12 to allow for the introduction of the reactants (e.g., precursors, co-reactants, and inert materials such as carriers) into the system 10. The inlet 16 is located in communication with any suitable source, such as a ProEvap® carrier gas operating system from which the reactants are delivered. A showerhead 18 is located downstream of the inlet 16 to facilitate the efficient dispersal and delivery of the reactants delivered from the source. The present invention is not limited to the use of a showerhead, however, as other similar devices are within the scope of this disclosure. A heating coil 20 or any other suitable heating device may be located at the inlet 16 to heat the reactants during delivery thereof from the source.

The reactants may be pre-cracking compositions, pre-reaction compositions, partial decomposition products, and/or other materials that are suitable for controllably altering reaction conditions in the deposition chamber to produce the desired film. Exemplary reactants include, but are not limited to, germanium n-butylamidinate (germanium precursor), tris (dimethylamido)antimony (antimony precursor), and diterbutyltelluride (tellurium precursor). Antimony precursors can include silylantimony precursors such as trisilylantimony, disilylantimony, alkyldisilylantimony, aminodisilylantimony, tris (trifluoromethyl)stibine, $Sb(CF_3)_3$, Lewis base adducts of $Sb(CF_3)_3$, and antimony trihydride (stibine), SbH3. deuterated analogs of the foregoing, and mixtures of two or more thereof.

A heating stage 24 is located in the deposition chamber 12. The heating stage 24 can be heated using any suitable source of energy to cause heat to radiate therefrom. For example, the heating stage 24 may be heated using an electric current. The present invention is not so limited, however, as the heating stage 24 can be heated using other means.

The heating stage 24 comprises one or more support pins 28 that extend therethrough, each support pins being configured to support a wafer 30 on which the GST materials are deposited. Any suitable number of support pins 28 can be used to support the wafer 30. For example, three support pins 28 arranged in a triangular pattern can be used. The present invention is not limited to any particular number of support pins 28 or any particular arrangement thereof, as any number and arrangement of support pins is within the scope of the present disclosure. Preferably, the areas of contact between the support pins 28 and the wafer 30 are minimal The support pins 28 may be fixed relative to the heating stage 24, or they may be extendable therethrough. In embodiments in which the support pins 28 are extendable through the heating stage, the wafer 30 may be elevated or lowered as desired.

The support structure in lieu of pins can utilize any supportive elements, support, stand, mount, suspension, holder, or positioning structure, to achieve the benefit deriving from the support pins.

In one process of using the system 10, a gas including one or more of Ge, Sb, and Te precursors and optionally one or more co-reactant gases are delivered into the deposition chamber 12 from the source via inlet 16. The wafer 30 is located at a distance of about 5 mm from the heating stage 24 and is, therefore, radiantly heated. Heat radiated from the heating stage 24 also heats the heat shield 14.

During and possibly prior to the deposition of materials, the precursors are activated in an activation region 38 of the deposition chamber 12. When the temperature of the heating stage 24 is about 320 degrees C. to about 400 degrees C., the temperature of the wafer 30 is about 160 degrees C. to about 240 degrees C. Because the heat shield 14 is in close proximity to the heating stage, the temperature of the heat shield 14 in the activation region 38 above wafer 40 has a temperature that is higher than that of the wafer. Preferably, the temperature of the heating stage 24 is maintained such that the temperature of the activation region 38 is about 100 degrees C. higher than that of the wafer 30.

Although the activation region 38 may be located anywhere in the deposition chamber 12 such that the source materials are activated, location of the activation region on the surface of the wafer means that the deposition of GST film is substantially a surface reaction. The present invention is not so limited, however, as there may be a gas phase reaction of source material prior to deposition on the wafer 30. However, any such gas phase reaction should be minimized The activation of chemical species used to form the chalcogenide material can be carried out in any suitable manner, e.g., with heating of such chemical species being effected thermally by any of various heat transfer modalities (conductive, convective, radiative), or in other manner such as infrared heating, plasma exposure, ultrasonic energy transfer, etc.

The pressure in the deposition chamber 12 is about 1 Torr to about 10 Torr, and preferably about 2.5 Torr. The present invention is not limited in this regard, however, as other pressures may be maintained in the deposition chamber 12 without departing from the broader aspects of the processes and apparatuses disclosed herein.

Figure 2A:
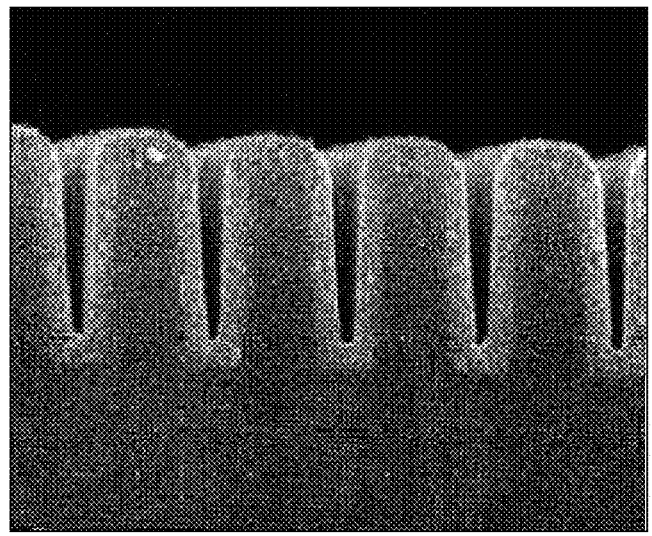
FIG. 2a is a representation illustrating the conformal deposition of GST film with a Ge:Sb:Te composition close to 4:1:5.

As is shown in FIG. 1, by supporting the wafer 30 using the support pins 28, the temperature to which the wafer is subjected is reduced (relative to the heating stage 24). As a result, a composition of GST having a Te content greater than 50% by increasing the influx of Te precursors without leading to the formation of crystalline GST films has been achieved, as shown in FIG. 2a. In FIG. 2b, an X-ray diffraction pattern is shown for a similar GST composition. Table 1 below shows examples of many such films. Using this process, GST can be obtained with a Ge:Sb:Te ratio of 4:1:5, 2:2:5, or the like.

TABLE 1

GST films with varying heating source temperatures and wafer temperatures.

| Thickness (nm) | Ge % | Sb % | Te % | N % | Heating Stage temperature (degrees C.) | Wafer temperature (degrees C.) |
|---|---|---|---|---|---|---|
| 12.9 | 25.4 | 30.9 | 43.9 | not measured | 322 | 160 |
| 7.5 | 39.4 | 16.9 | 43.7 | not measured | 342 | 180 |
| 33.8 | 18 | 30.9 | 51.2 | not measured | 342 | 180 |
| 42.6 | 14.5 | 29.1 | 56.3 | 0 | 362 | 197 |
| 41.6 | 31.3 | 12.4 | 52.2 | 4.1 | 362 | 197 |
| 36.6 | 30.6 | 14.8 | 49.3 | 5.33 | 362 | 197 |
| 16 | 45.3 | 5.09 | 49.7 | not measured | 362 | 197 |
| 27 | 32.7 | 14.9 | 48.9 | 3.46 | 382 | 220 |
| 35 | 23 | 24 | 53 | 0 | 402 | 240 |
| 39 | 20 | 25 | 55 | 0 | 402 | 240 |
| 13.3 | 35.6 | 10.3 | 54.1 | not measured | 402 | 240 |
| 195 | 9 | 0.8 | 84 | 5.4 | 402 | 240 |

Figure 3:
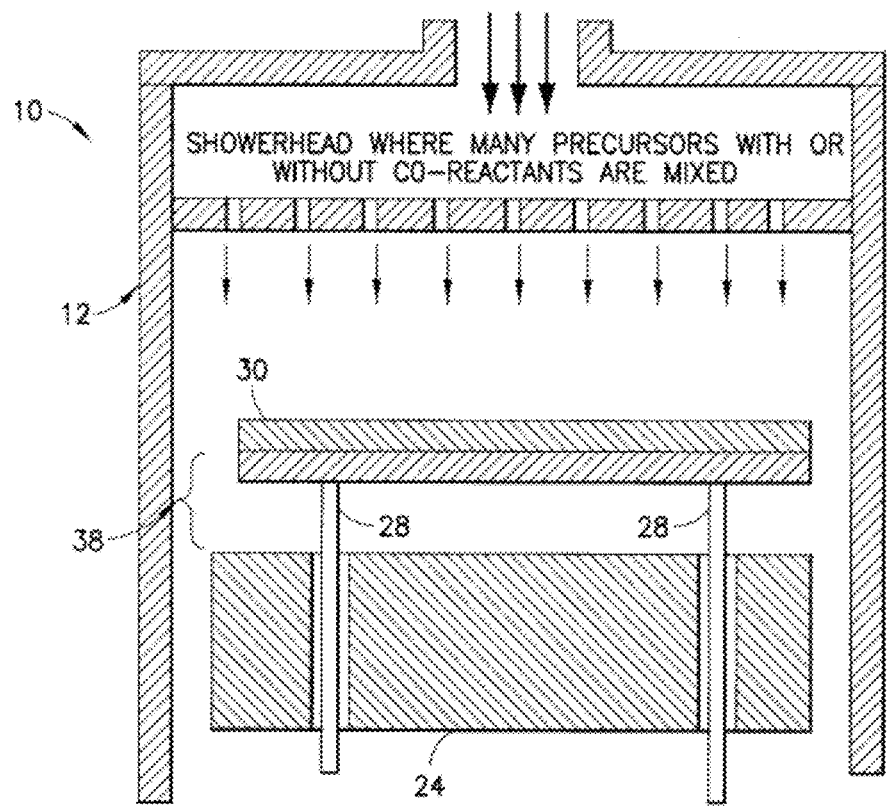
FIG. 3 is a schematic representation of another GST deposition process of the present invention.

As is shown in FIG. 3, the wafer 30 may be elevated by the support pins 28 and located thereon such that the device side of the wafer faces the heating stage 24. In such an embodiment, the device side of the wafer 30 is heated by thermal radiation to a temperature of about 180 degrees C. to about 240 degrees C. by the heating stage 24, which is at a temperature of about 340 degrees C. to about 420 degrees C.

Figure 4:
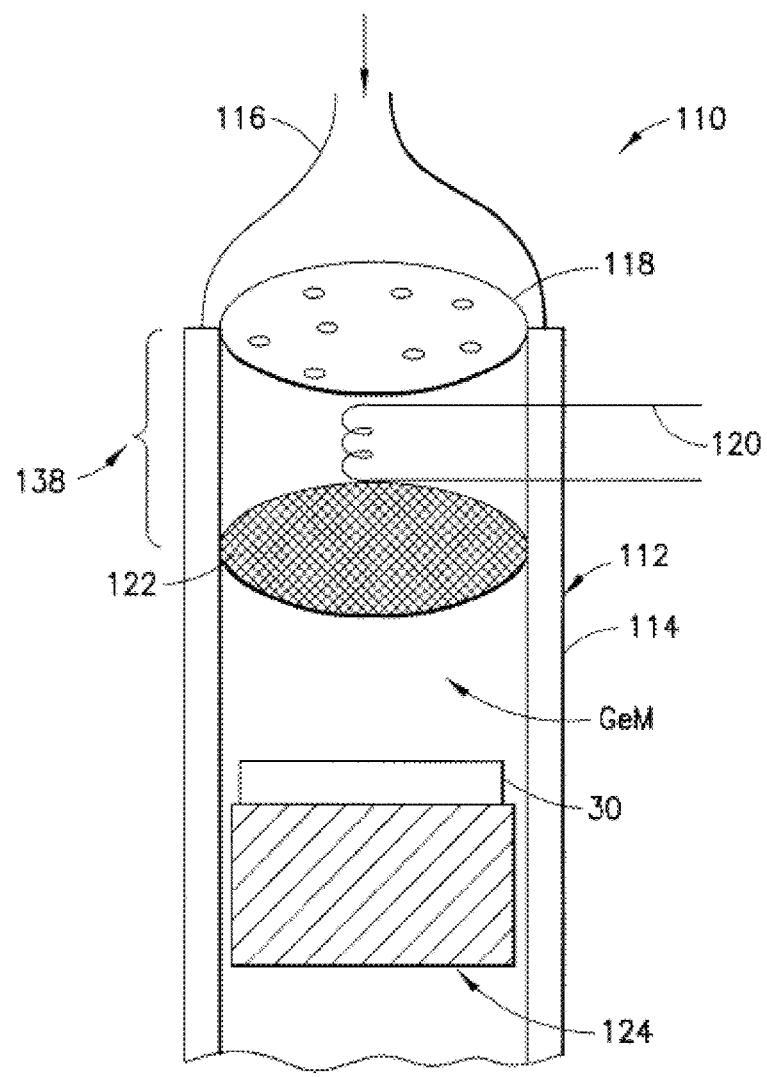
FIG. 4 is a schematic representation of another GST deposition process of the present invention.

In another embodiment of the present invention as is shown in FIG. 4, a system for producing and depositing low temperature GST materials is generally designated by the reference number 110 and hereinafter referred to as "system 110." In the process of using system 110, GST materials are again deposited onto a wafer 30 to form a PCM device.

In the system 110, a deposition chamber 112 is defined by at least one wall 114, the inner surface of which defines a heat shield. An inlet 116 is located in the deposition chamber 112 to allow for the introduction of precursors, co-reactants, and inert materials. The inlet 116 is located in communication with any suitable source, such as a ProEvap® carrier gas operating system from which the precursors and/or other materials are delivered. A showerhead 118 or similar device is located between the inlet 116 and the wall 114 of the deposition chamber 112 to facilitate the efficient dispersal and delivery of the precursors and/or other materials delivered from the source. A screen 122 is located downstream of the showerhead 118. The screen 122 may be a copper mesh that is operably associated with a heating mean 120 to distribute heat at a substantially uniform temperature throughout the cross-sectional area of the path through which the precursors and co-reactants flow. The present invention is not limited in this regard, however, as other materials may comprise the screen. In addition, in lieu of a screen, any other structural element or component can be employed that is effective to distribute heat in the flow path as desired. For example, the heat distributor can include an array of rods extending across the flow path, heat transfer fins, shrouding flows of gas, turbulators, or any other structural feature or features that effect heat distribution in the flow path. In addition to copper, and other suitable conductive metals can be utilized, such as aluminum, nickel, brass, chromium steel alloys, etc., as a material of construction for the heat distributor structure. The volume between the showerhead 118 and the screen 122 defines an activation region 138, which includes the heating means 120.

The deposition chamber 112 includes a heating stage 124 located therein. The heating stage 124 can be heated using any suitable source of energy. The wafer 30 is located on the heating stage 124.

In one process of using the system 110, a source gas including the precursors and optionally one or more co-reactant gases are delivered into the deposition chamber 112 via inlet 116. After passing through the showerhead 118 and entering the activation region 138, the source gas is heated via the heating means 120, thereby activating the precursors before being deposited on the wafer 30. As the heated source gas passes through the screen 122, the heated source gas is substantially uniformly and evenly dispersed.

As is shown in FIG. 4, by activating the precursors in the activation region 138 prior to deposition onto the wafer 30 in the form of a film, some degree of gas phase reaction is affected. However, in the system 110, the gas phase reaction should be minimized. The final film deposition is preferably the result of a surface reaction that also occurs as the film is deposited onto the wafer 30. As is shown in Table 2 below, the reaction can be carried out at wafer temperatures as low as 150 degrees C. and activation region temperatures as low as 200 degrees C. Raising the wafer temperature to 200 degrees C. while the activation zone temperature is 200 degrees C. can also lead to the film formation. However, without the 200 degrees C. activation zone, a wafer temperature of 200 degrees C. alone will not provide the film properties and beneficial characteristics that are most desirable for GST film formation, particularly for the desired high Te GST formation.

TABLE 2

Process Results based on configuration of FIG. 4.

| Experimental Run # | Thickness (A) | Ge % | Sb % | Te % | Activation region temperature (degrees C.) | Wafer temperature (degrees C.) |
|---|---|---|---|---|---|---|
| #3031 | 101.8 | 24.7 | 22.3 | 53 | 220 | 150 |
| #3032 | 67 | 29.6 | 11.2 | 67 | 220 | 150 |
| #3033 | 42.7 | 35 | 9.4 | 55.8 | 220 | 150 |
| #3034 | 57 | 30.1 | 28.5 | 41.4 | 220 | 130 |
| #3035 | 79.7 | 18 | 31.7 | 50.3 | 200 | 200 |
| #3036 | 58.8 | 30.1 | 28 | 58.8 | 220 | 150 |

Figure 5:
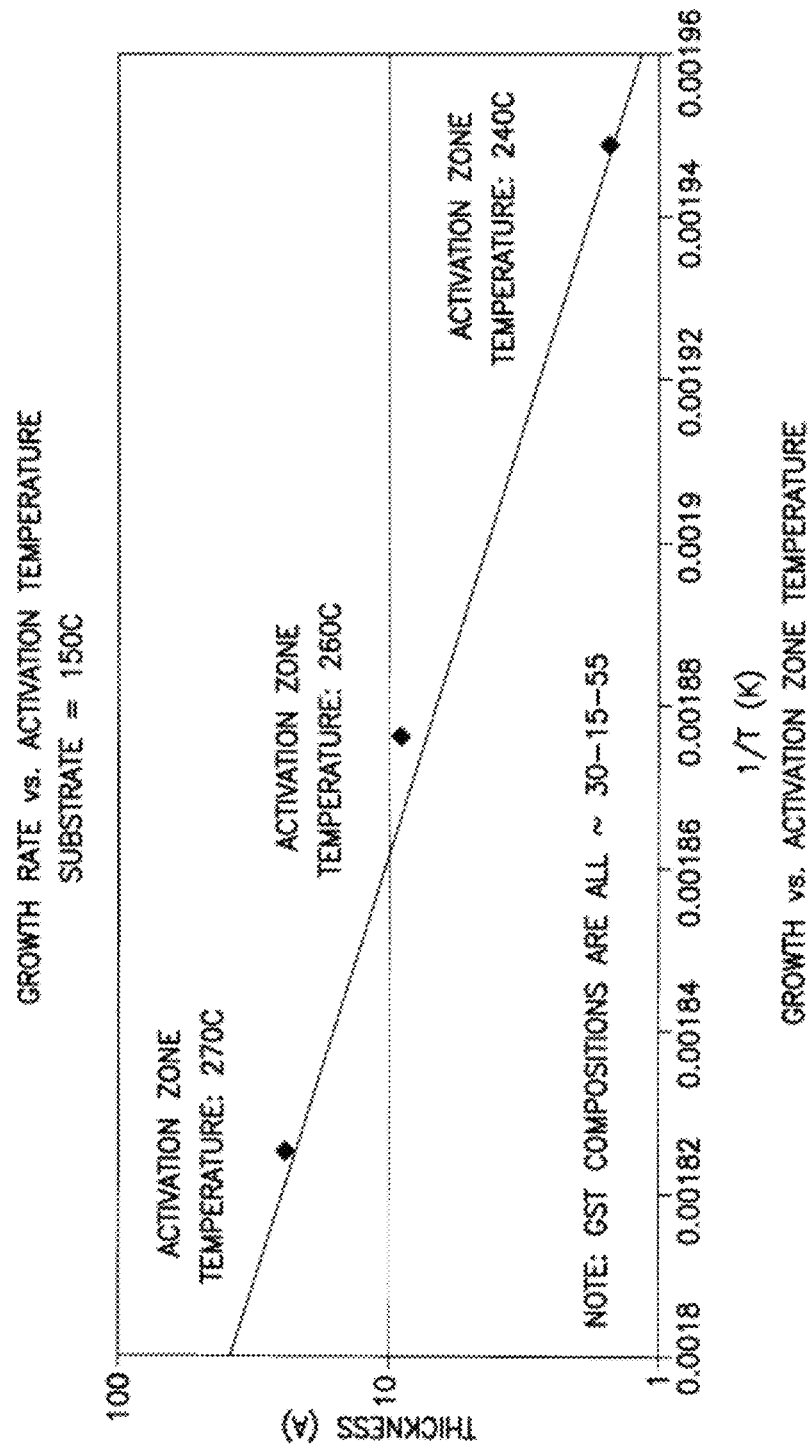
FIG. 5 is a graphical representation of growth rate of a GST composition versus the inverse of the activation region temperature.
Figure 6:
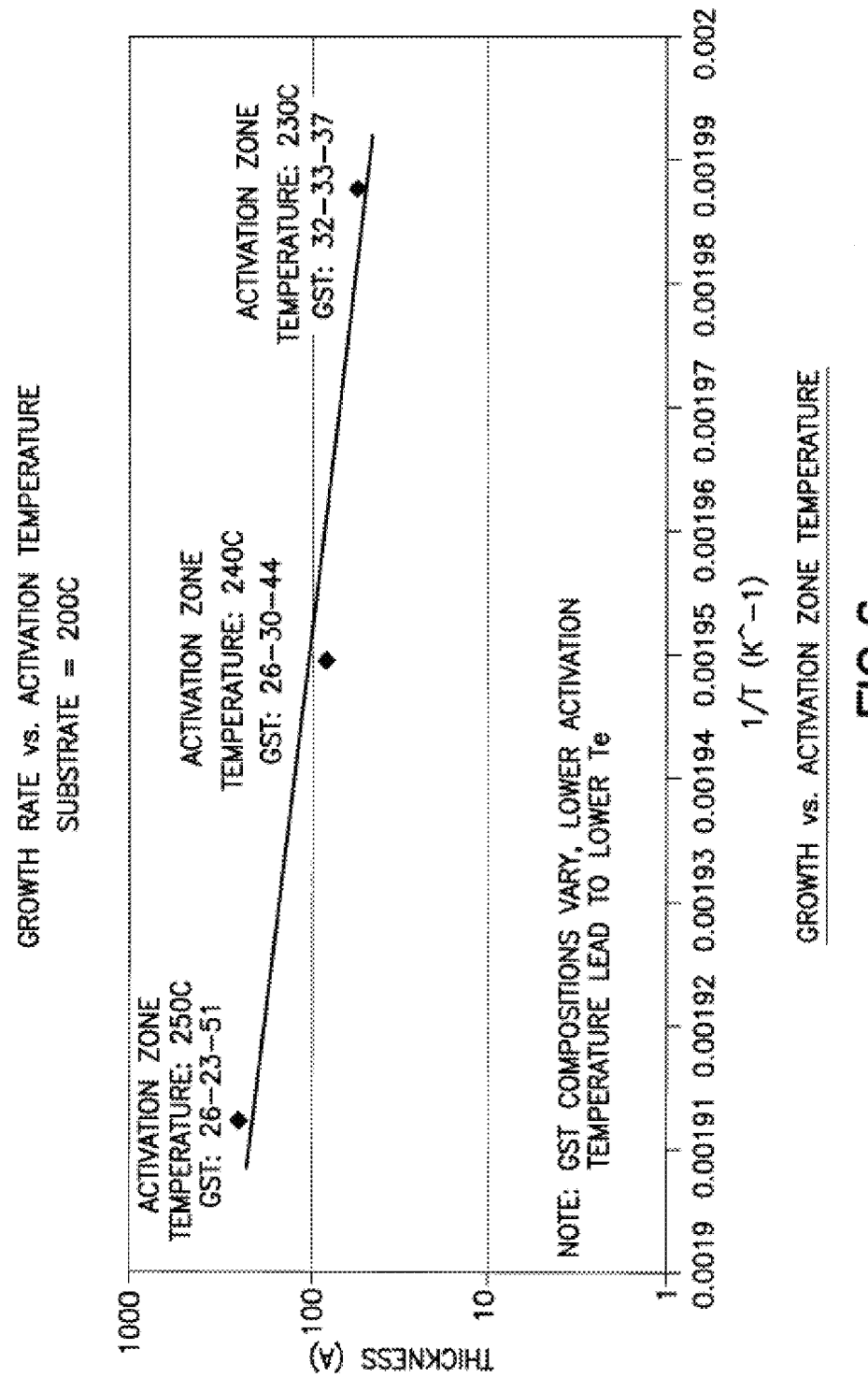
FIG. 6 is a graphical representation of growth rate of a GST composition versus the inverse of the activation region temperature.

In FIG. 5, the growth (in terms of thickness measured in Angstroms) of the film deposited on the wafer 30 is plotted versus the reciprocal of temperature for a GST composition having the ratios of 30:15:55. As can be seen, the growth rate decreases as the temperature in the activation region is decreased from 270 degrees C. to 240 degrees C. when the wafer is maintained at 150 degrees C. In FIG. 6, when the wafer 30 is 200 degrees C., a similar growth rate decrease is observed, thereby indicating that lower activation region temperatures lead to lower amounts of Te deposited.

Not all the precursors or co-reactants need be activated in the activation region 138. Each precursor and co-reactant can be activated separately at different temperatures to maximize the efficiency of the deposition of the film. The separate activation may further avoid the over activation of less stable precursors and thus avoid resulting in undesirable precursor by products or the premature consumption of the precursors by deposition (such as the formation of particles via gas phase reaction). In particular, one or more components of the source gas may be added downstream of the activation region 138. For example, in the configuration of the system 110 as shown in FIG. 4, the Te and Sb precursors and co-reactants are passed through the activation region 138 with the germanium precursor (GeM) being added downstream of the activation region 138. In doing so, the temperature of the germanium precursor can be controlled independently of the temperatures of other precursors and/or co-reactants, and a deposition process can be obtained in which the temperature of the wafer 30 can be about 110 degrees C. and the temperature in the activation region 138 can be as low as about 186 degrees C., as shown in Table 3.

In all embodiments, one or more components of the gas utilized to form the chalcogenide material can be added downstream of the activation region, as part of an overall arrangement to preferentially activate one or more, but not all, of the components of the gas used for vapor deposition of the chalcogenide material.

TABLE 3

Deposition results with internal GeM source.

| Run | Ge % | Sb % | Te % | Thickness | Activation region temperature (degrees C.) | Wafer temperature (degrees C.) |
|---|---|---|---|---|---|---|
| 3031 | 24.7 | 22.3 | 53.0 | 101.8 | 220 (heating coil 0.5 in. above wafer) | 150 |
| 3032 | 29.6 | 11.2 | 59.2 | 67 | 220 | 150 |
| 3033 | 35.0 | 9.25 | 55.8 | 42.7 | 220 | 130 |
| 3034 | 30.1 | 28.5 | 41.4 | 56.6 | 186 | 125 |
| 3035 | 18.0 | 31.7 | 50.3 | 79.7 | 200 | 200 |
| 3036 | 30.1 | 28.0 | 41.9 | 58.8 | 186 | 110 |

Figure 7:
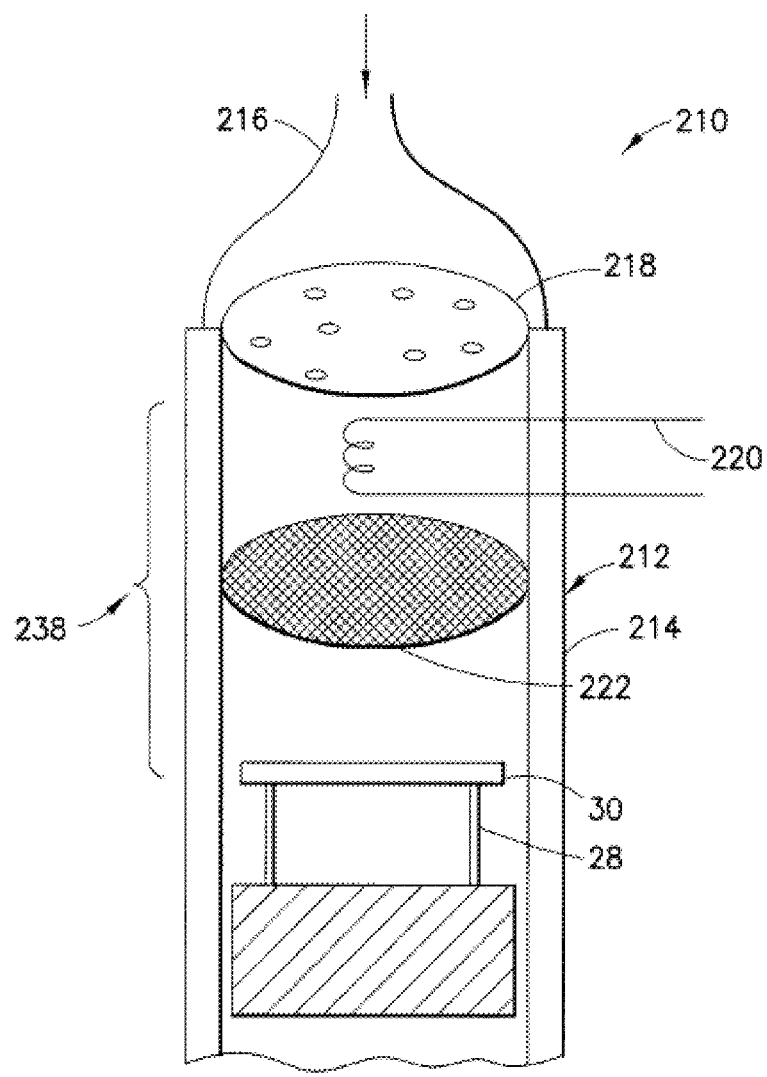
FIG. 7 is a schematic representation of another GST deposition process of the present invention.

Referring now to FIG. 7, another embodiment of a system for producing and depositing low temperature GST materials is generally designated by the reference number 210 and hereinafter referred to as "system 210." In the process of using system 210, GST materials are again deposited onto a wafer 30 to form a PCM device.

In the system 210, a deposition chamber 212 is defined by at least one wall 214, and an inlet 216 is located in the deposition chamber to allow for the introduction of precursors, co-reactants, and inert materials. The inlet 216 is located in communication with any suitable source, such as a Pro-Evap® carrier gas operating system from which the precursors and/or other materials are delivered. A showerhead 218 or similar device is located between the inlet 216 and the wall 214 of the deposition chamber 212 to facilitate the efficient dispersal and delivery of the precursors and/or other materials delivered from the source into an activation region 238 that includes a heating means 220. The activation region 238 may extend from the inlet 216 to the wafer 30, or it may be any portion thereof. A screen 222 may or may not be located downstream of the showerhead 218 to facilitate the efficient dispersal of precursors into and/or through the activation region 238.

The deposition chamber 212 includes a heating stage 224 located therein. The heating stage 224 can be heated using any suitable source of energy. The wafer 30 is located on support pins 28 that are extendable from the heating stage 224 to elevate the wafer from the surface of the heating stage. The distance that the wafer 30 is elevated from the heating stage 224 is variable depending upon the desired temperature of the wafer and the operating temperatures in the deposition chamber 212.

In one process of using the system 210, source gas including precursors and optionally one or more co-reactant gases are delivered into the deposition chamber 212 via inlet 216. After passing through the showerhead 218 and entering the activation region 238, the source gas is heated via the heating means 220, thereby activating the precursors before being deposited on the wafer 30.

By activating the precursors in the activation region 238 prior to deposition onto the wafer 30, a gas phase reaction is effected. However, the system 210 is not limited to a gas phase reaction, as there may be some degree of surface reaction also occurring as the film is deposited onto the wafer 30.

Figure 8:
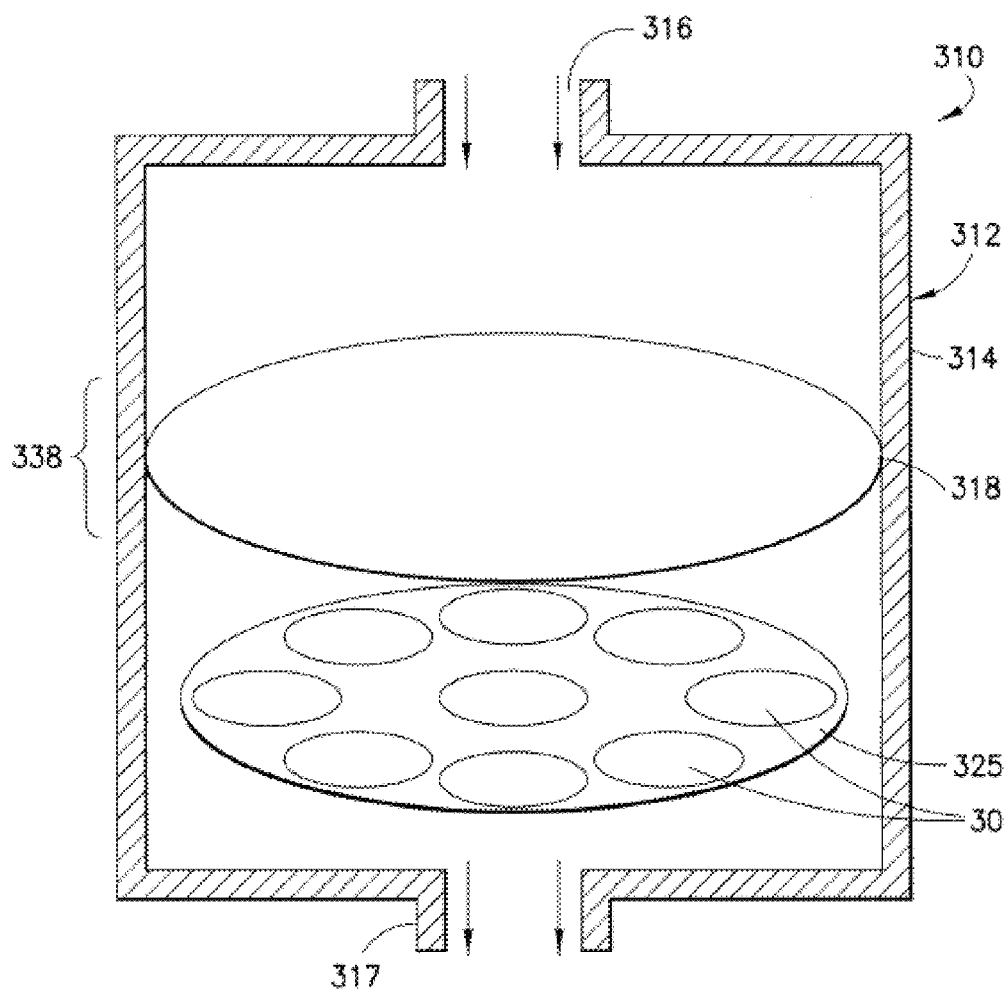
FIG. 8 is a schematic representation of GST deposition process of the present invention incorporating a side-by-side arrangement of wafers on a rotatable carousel.

As is shown in FIG. 8, another embodiment of the process of depositing a GST film comprises arranging a plurality of wafers in a side-by-side batch configuration in a system 310. System 310 comprises a deposition chamber 312 defined by a wall 314. An inlet 316 is located at an upstream end of the deposition chamber 312. A showerhead 318 is located downstream of the inlet 316. Wafers 30 are located on a carousel 325 downstream of the showerhead 318. The wafers 30 may be any suitable size (e.g., about 12 inches in diameter) and arranged such that the device side to be coated by the film faces the showerhead 318. Rotation of the carousel 325 facilitates the substantially uniform deposition of the film on the wafers 30. An outlet 317 is located downstream of the carousel 325.

The showerhead 318 is a heatable porous plate or mesh net capable of sustaining temperatures of about 180 degrees C. to about 450 degrees C. such that precursors passing therethrough can be activated. Thus, the showerhead 318 defines an activation region 338. Upon heating the precursors passing through the activation region 338, the precursors are activated in a gas phase reaction and are subsequently dispersed and transported to the wafers 30.

Figure 9:
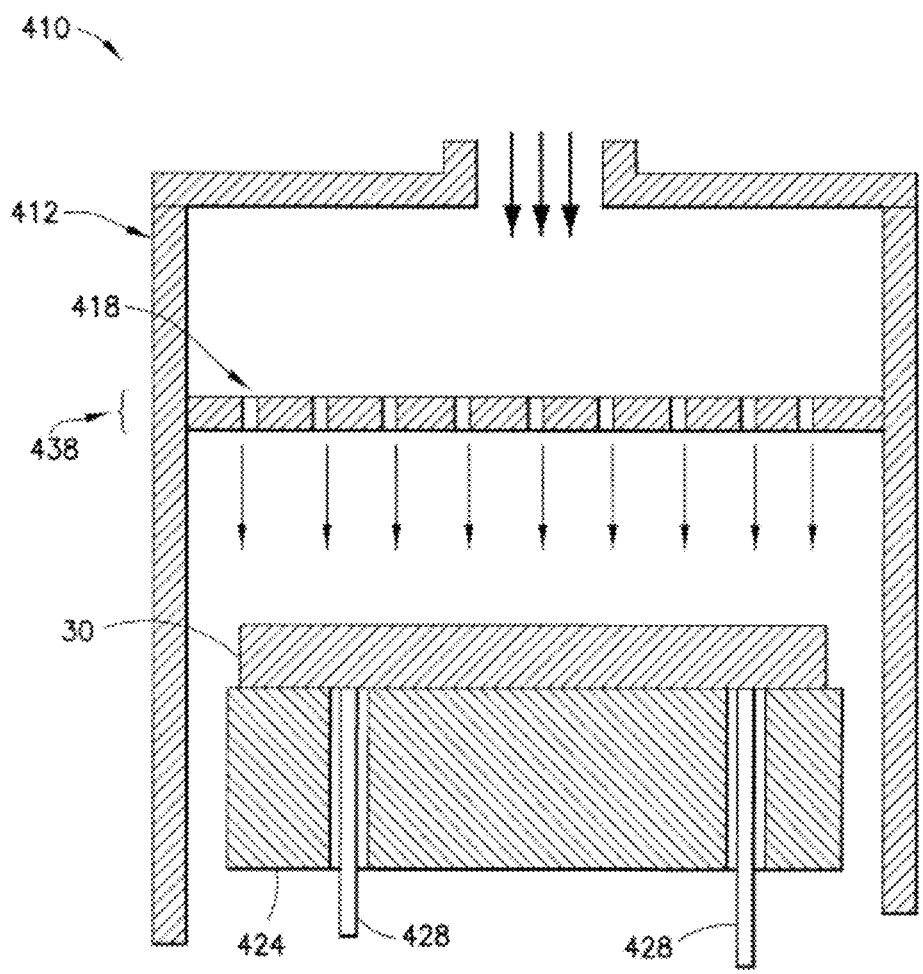
FIG. 9 is a schematic representation of another GST deposition process of the present invention.

Other configurations of the deposition system are within the scope of the present invention. As is shown in FIG. 9, a single-wafer deposition system 410 ("system 410") is shown as comprising a deposition chamber 412 having a heatable showerhead 418 in which the wafer 30 is located on a heating stage 424. The showerhead 418 defines an activation region 438 and is heatable to about 180 degrees C. to about 450 degrees C., while the heating stage 424 is maintained at a temperature below the temperature of the showerhead 418. In this embodiment, the present invention is not limited to the wafer 30 being located directly on the heating stage 424, as support pins 428 or the like may be used to lift the wafer off the surface of the heating stage as desired.

Figure 10:
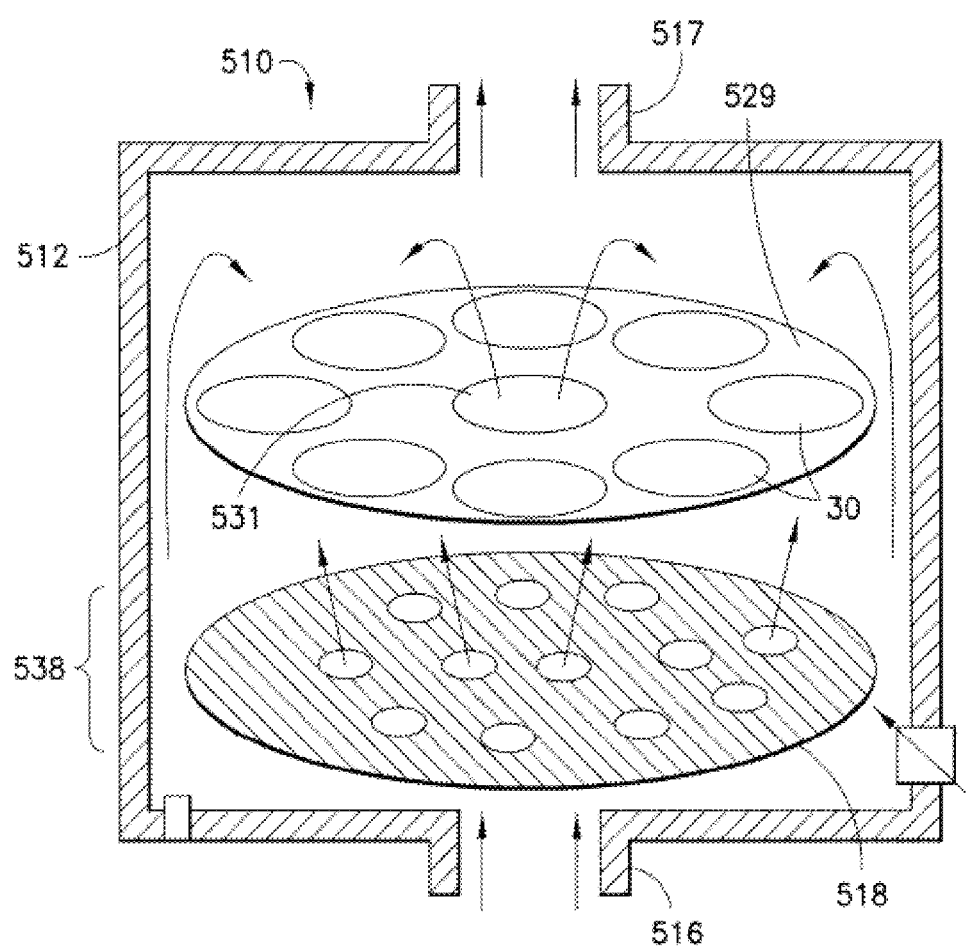
FIG. 10 is a schematic representation of GST deposition process of the present invention incorporating a side-by-side arrangement of wafers.

As is shown in FIG. 10, a multiple-wafer system is shown as "system 510." System 510 comprises a deposition chamber 512 into which precursors are introduced through an inlet 516 at a lower end thereof. A vacuum source or the like may be located at an outlet 517 of deposition chamber 512 to allow for fluid flow from the inlet 516 and through the deposition chamber for removing precursors and/or co-reactants not deposited on the wafer 30. The precursors pass through a showerhead 518 (or similar mesh structure) that heats and thereby activates the precursors. The showerhead 518 is, therefore, the activation region 538 and is maintained at a temperature of about 200 degrees C. to about 320 degrees C.

In system 510, the wafers 30 are horizontally located in a side-by-side arrangement on a plate 529 located above and downstream of the showerhead 518. The plate 529 includes one or more apertures 531 that facilitate transport of the precursors from the activation region 538 to the device sides of the wafers 30. The plate 529 may include a heating element to provide additional heating to the wafers 30 located thereon. Furthermore, locating the wafers 30 on the plate 529 allows the plate to serve as a shield to prevent deposition of film on the backsides of the wafers.

Figure 11:
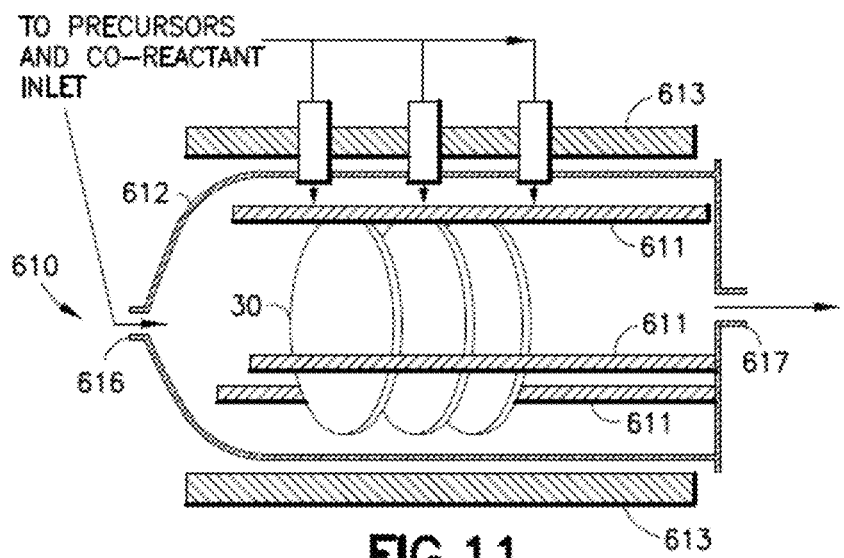
FIG. 11 is a schematic representation of GST deposition process of the present invention incorporating a tube batch process.
Figure 12:
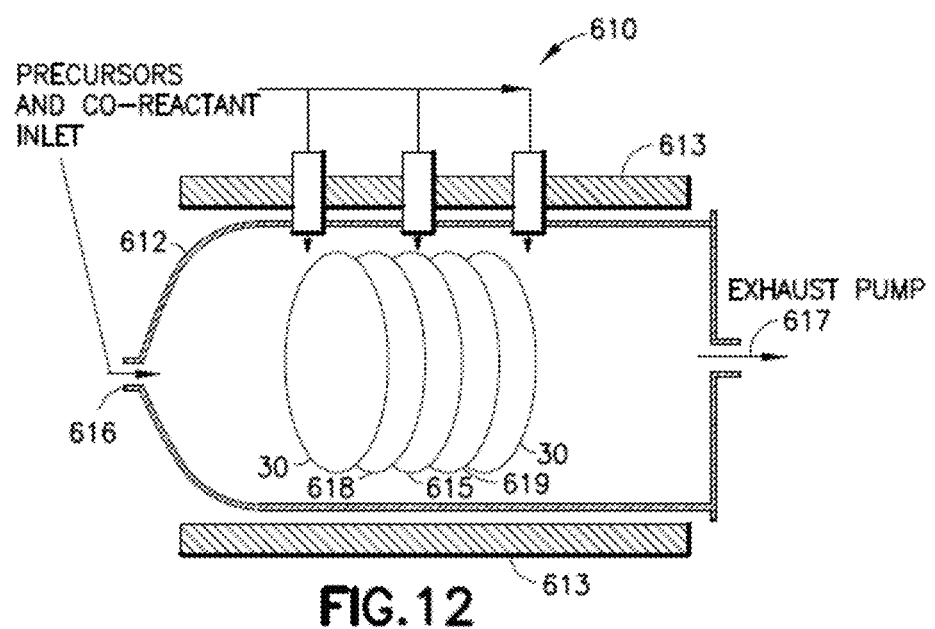
FIG. 12 is a schematic representation of GST deposition process of the present invention incorporating a tube batch process.

The present invention is not limited to either single wafers or multiple wafers horizontally arranged. As is shown in FIGS. 11 and 12, wafers may be stacked vertically in a tube batch processing system. In FIG. 11, one system for tube batch processing of wafers for the deposition of GST film is illustrated by the reference number 610. In system 610, wafers 30 are mounted on rails 611 in a deposition chamber 612 such that the fronts (device sides) face the backsides of adjacently-positioned wafers. Precursors and optional co-reactants are introduced into the deposition chamber 612 via an inlet 616. An outlet 617 provides for exhaust of the introduced precursors. Optional or additional precursors and/or co-reactants may be added at various points along the length of the deposition chamber 612 to promote uniformity of deposition of film onto the wafers 30. External heaters 613 may also be disposed along the length of the deposition chamber 612 between the inlet 616 and the outlet 617 to maintain the external temperature of the system 610 at about 200 degrees C. The rails 611 on which the wafers 30 are mounted may also be heated to maintain the temperature within the deposition chamber 612 at about 320 degrees C. to about 400 degrees C. The backsides of each of the wafers 30 may serve as shields to direct or otherwise affect the gas phase reaction of the precursors prior to deposition onto the device sides of the wafers to form GST films.

Referring to FIG. 12, the heated rails 611 are not shown, but an additional plate heater 615 may be located between the mounted wafers 30 to maintain the temperature in the deposition chamber 612 at about 320 degrees C. or greater. Optional shields 619 may be located adjacent the plate heater 615 and/or wafers 30 to direct or otherwise affect the gas phase reaction of the precursors prior to deposition onto the device sides of the wafers to form GST films.

The embodiments of FIGS. 11 and 12 illustrate the system for tube batch processing as being horizontally arranged and the wafers being vertically mounted. The present invention is not limited in this regard, as the deposition chamber 612 may be vertically mounted with the wafers 30 horizontally stacked relative to other wafers in the deposition chamber.

In any embodiment, the precursors are activated together with co-reactants by being heated or otherwise energized or excited, thereby providing for increased reactivity in the activation regions. The passage of the precursors and co-reactants along the length of the activation regions partly determines the degree of reactivity of the precursors. Furthermore, the heating element(s) can be located inside the heating stages of the deposition chambers, or they can be located in the showerhead upstream of the substrate, upstream of the showerhead and downstream of the inlet, or even further upstream in the inlet through which the precursors and co-reactants are introduced. Multiple heating sources can be used for achieving uniform thermal activations of precursors.

From a process aspect, the Ge, Sb, and Te precursor vapors can be used with or without co-reactants such as ammonia gas, hydrogen, nitrogen, or other suitable gases. A gas flow rate can be about 20 to about 200 standard cubic centimeter per minute (sccm), particularly for a one inch size substrate (wafer coupon). Gas flow rates are scaled up accordingly for larger size substrates (e.g., 300 mm or 8 inch wafers), for example to a range of from 200 to about 2000 sccm. Also, ammonium gas at 200 sccm can be diluted to 50 sccm using a hydrogen flow at 150 sccm to decrease the growth rate or to promote conformal fill benefits. Reduced process pressure from 2.5 Torr to lower values (e.g., to about 0.25 Torr) may also improve chemical mass transfer functions and provide for better uniformity and improved conformal deposition. On the other hand, higher pressures at 10 Torr can improve the growth rate due to higher molecular concentrations from the precursors being available. More broadly, chamber pressures in a range of from 1 torr to about 100 torr can be employed, in various embodiments. Diluent gases such as Ar, $N_2$, He, and combinations thereof can also be introduced from a bubbler or a ProEvap® carrier gas operating system (ATMI, Inc., Danbury, Conn., USA).

Figure 13A:
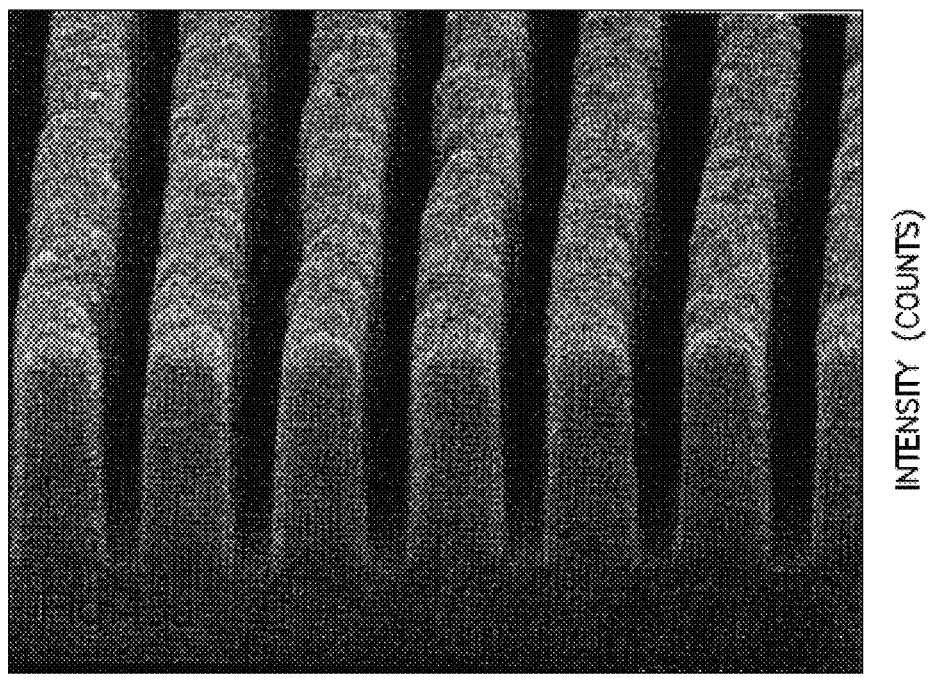
FIG. 13a is a representation illustrating the conformal deposition of GST film with a Ge:Sb:Te composition close to 2:2:5.
Figure 13B:
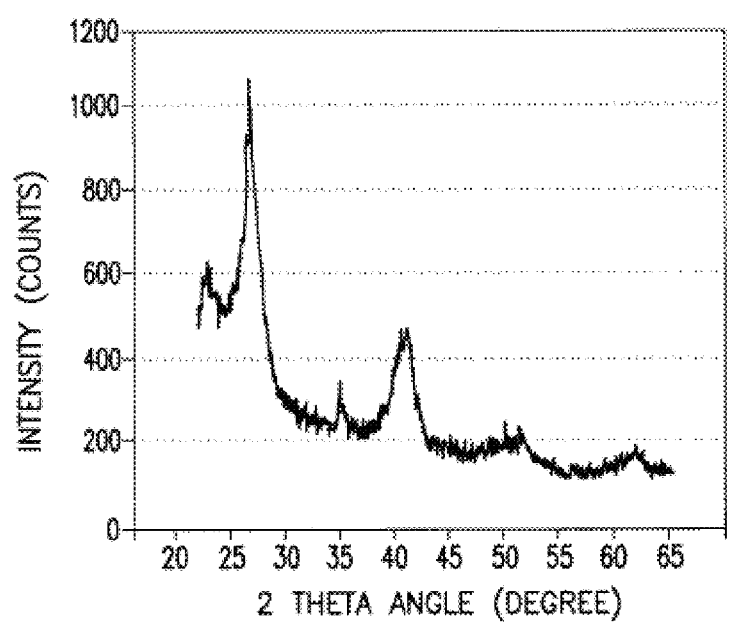
FIG. 13b is an X-ray diffraction scan pattern of a GST film with a Ge:Sb:Te composition close to 2:2:5 showing some crystalline characteristics.
Figure 14A:
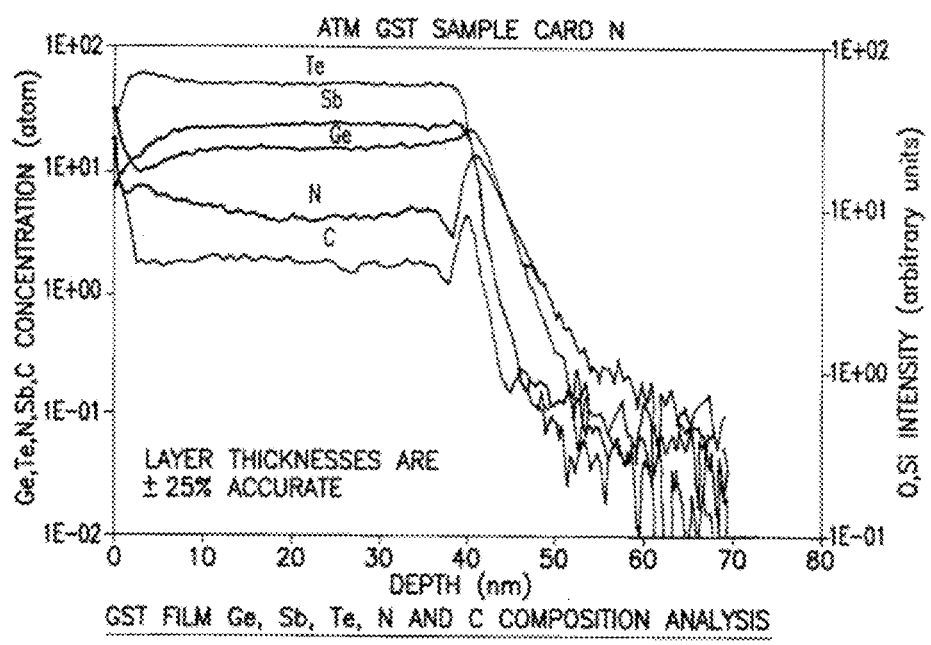
FIG. 14A is a graphical representation illustrating GST film having C and N therein.
Figure 14B:
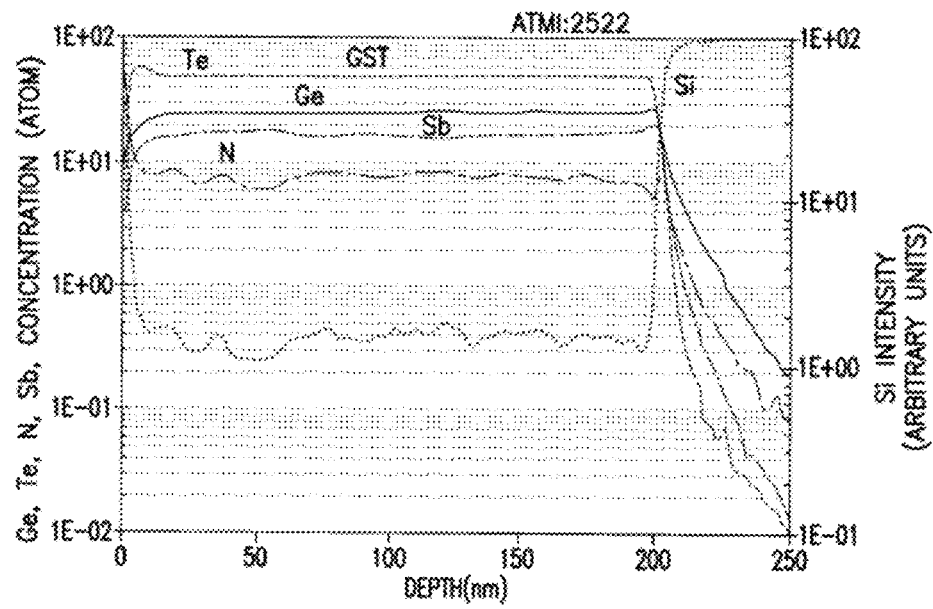
FIG. 14B is a graphic representation illustrating GST film having about 8% N therein.
Figure 14C:
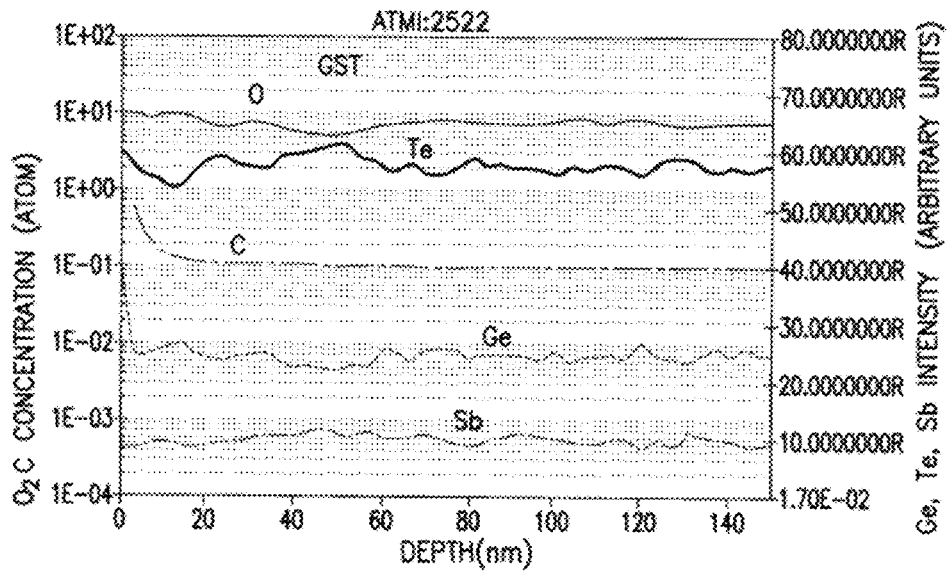
FIG. 14C is a graphic representation illustrating GST film having about 10% N therein.

In any embodiment, dopants such as N, C, In, Sn, Se, and combinations of the foregoing can be added to the GST film to produce a film having the formula $Ge_xSb_yTe_zA_m$, wherein A is the dopant element and wherein x is about 0.1-0.6, y is about 0-0.7, z is about 0.2-0.9, and m is about 0-0.15. As is shown in FIG. 13a, a scanning electron micrograph representation of a GST film having a nitrogen dopant illustrates substantially conformal deposition deep into vias having high aspect ratios. In FIG. 13b, an X-ray diffraction scan pattern of an as-grown film illustrates that the film is conformal and amorphous. In FIG. 14, a Secondary Ion Mass Spectroscope (SIMS) scan of a GST film shows the Ge, Sb, Te, and N content distribution. As can be seen in FIG. 14A, both carbon and nitrogen doping can co-exist in a GST film. FIG. 14B and FIG. 14C show nitrogen and carbon as measured separately. Advantageously, carbon doping may reduce the reset current of the GST film, and nitrogen doping may improve conformality of the film. It is estimated that carbon doping reduces the reset current by 2-3 times.

In any embodiment, after the film is deposited, the wafer 30 may be subjected to an annealing process to reduce nitrogen content if it is deemed desirable to reduce the content of nitrogen at this stage. Table 4 below lists the experimental results.

TABLE 4

|  | Composition of GST as-deposited | Composition of GST post 45 min annealing |
| --- | --- | --- |
| Experiment #1 | 413.9A, 35.4% Ge, 3.6% Sb, 45.7% Te, 15.27% N | 45.9% Ge, 4.5% Sb, 47.1% Te 2.43% N after 350 C. 45 min annealing |
| Experiment #2 | 396.9A, 43.9% Ge, 4.88% Sb, 51.2% Te 11% N measured seperately | 368.3A, 44.3% Ge, 5.2% Sb, 49.6% Te, 0.91% N after 350 C. 45 min annealing |
| Experiment #3 | 355.3A, 36.2% Ge, 5.0% Sb, 42.4% Te, 16.31% N | 296.0A, 44.2% Ge, 6.6% Sb, 49.1% Te, 0.08% N after 350 C. 45 min annealing |

It will be recognized that the nitrogen content of the films after annealing are substantially reduced in relation to the nitrogen content of the as-deposited films. It will be correspondingly appreciated that the content of nitrogen, carbon and other film components is to be understood in the context of the description herein as referring to the film content after annealing and/or other post-deposition processing, unless otherwise expressly stated.

As discussed earlier herein, the systems and processes of the present disclosure can be implemented with activation of one or more precursors in the inlet of the deposition chamber. In other implementations, pre-activation of one or more of the precursors may be carried out in a pre-activation zone that is outside the deposition chamber, e.g., a separate pre-activation chamber that may for example be arranged in series or other flow arrangements with respect to the deposition chamber. Such dedicated pre-activation chamber can in many instances be more closely controlled as to its temperature, in relation to activation heating within the deposition chamber. This in turn may enable precursor activation to be achieved without excessive shift of the process baseline, and with increased capacity to avoid particle generation that may sometimes occur in the heating zone of the deposition chamber if temperature of the heating zone falls below desired operating conditions.

The pre-activation chamber is desirably operated at substantially higher temperature than inside the chamber, in order to minimize susceptibility to particle formation. Pre-activation is typically used for one more precursors that are typically only partially decomposed at high temperature. By selectively activating these high temperature-decomposable precursors, without activating the other precursors that are able to be deposited at lower temperature without the need for pre-activation, highly energy-efficient operation can be attained that is productive of superior film formation on the substrate.

In some systems and processes, the Ge, Sb and Te precursors may be passed into the deposition chamber without pre-activation, but such pre-activation may be employed to make one or more of such precursors more effective in low temperature deposition.

In other implementations, multiple showerheads may be employed. For example, to showerheads may be utilized, one for pre-activated precursor(s) and another for non-pre-activated precursor(s). For such purpose, the two showerheads may be interlaced with one another and arranged to uniformly distribute both the one or more pre-activated precursor and non-pre-activated precursor over the entire wafer surface.

Figure 16:
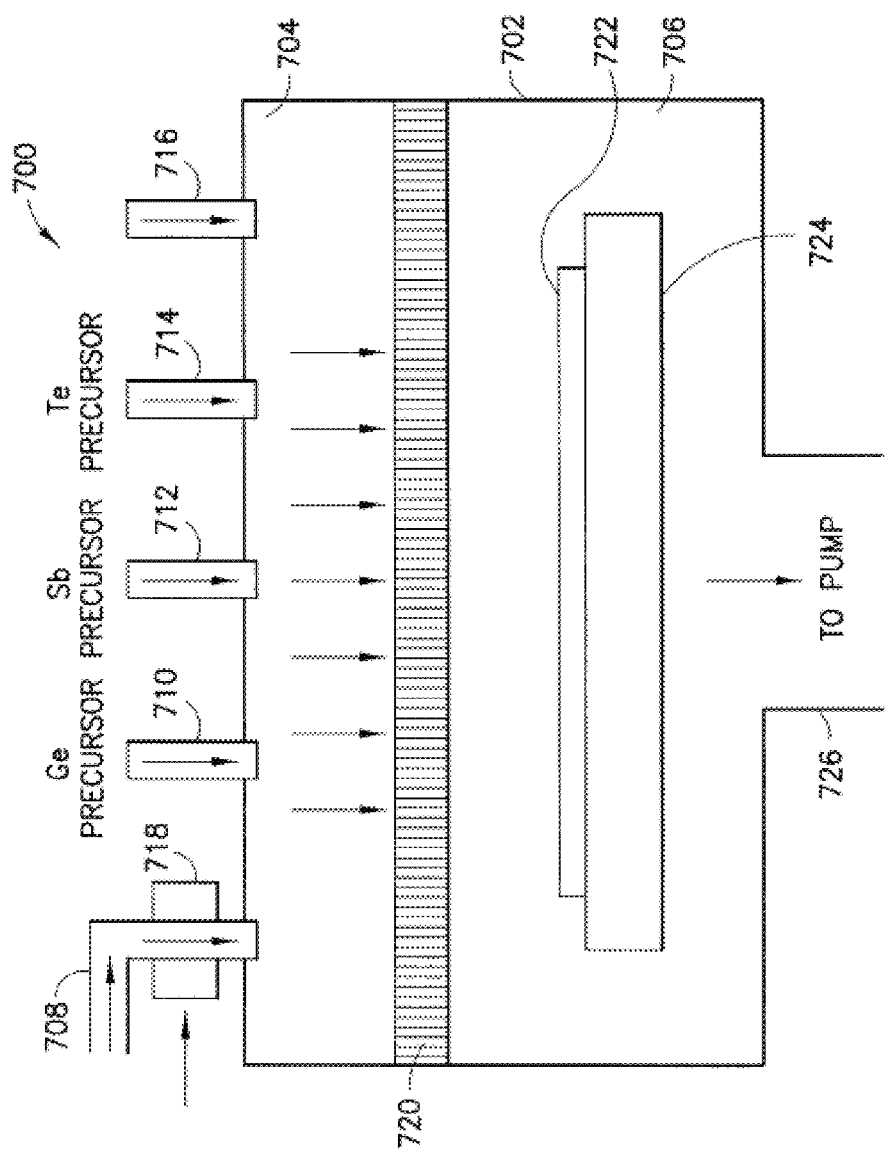
FIG. 16 is a schematic representation of a deposition system including multiple precursor and co-reactant inlets, wherein the deposition chamber is partitioned by a showerhead into a mixing portion and a deposition portion, with the wafer in the deposition portion having its device side facing the showerhead.

FIG. 16 is a schematic representation of a deposition system 700 including multiple precursor and co-reactant inlets 708, 710, 712, 714 and 716, wherein the deposition chamber 702 is partitioned by a showerhead 720 into a mixing portion 704 and a deposition portion 706, with the wafer 722 in the deposition portion having its device side facing the showerhead.

The deposition chamber 702 thus encloses an interior volume including mixing portion 704 and deposition portion 706, bounded by the showerhead 720 therebetween. The showerhead extends laterally across the full cross-section of the deposition chamber, generally perpendicular to the vapor flow direction indicated by the several arrows.

As illustrated in FIG. 16, inlet 708 is equipped with a heater 718 to provide localized heating of a carrier, precursor, co-reactant or other material flowed through such inlet into the mixing portion 704 of the interior volume in the deposition chamber. In like manner other inlets can be similarly equipped, or coupled in heat transfer relationship with heating circuits, heat exchangers, heating jackets, in an appropriate manner to provide desired heating to the materials being flowed through the respective inlets to the mixing portion of the interior volume of the deposition chamber.

In addition, the deposition chamber itself may be heated directly or indirectly to appropriate temperature. The showerhead 720 can be of any suitable type, and can for example be constituted by a porous sintered metal plate providing suitable porosity and flow conductance for passage of vapor resulting from the mixing of precursors, co-reactants if present, and other materials that may be introduced into the mixing portion of the deposition chamber. Alternatively, the showerhead 720 can be of a plate or disk conformation, having a multiplicity of holes therethrough constituting vapor flow passages.

In the deposition portion of the interior volume, a substrate heater 724 is mounted, as schematically shown, with a wafer positioned thereon with its device side facing the downstream face of the showerhead 720. Thus, vapor resulting from the mixing in the mixing portion 704 of the deposition chamber passes through the showerhead and is contacted with the device side of the wafer 722 for deposition of material thereon. Effluent vapor resulting from such contacting of the wafer then passes into the outlet 726 under the action of a pump (not shown) and maybe flowed to treatment or other disposition thereof.

Figure 17:
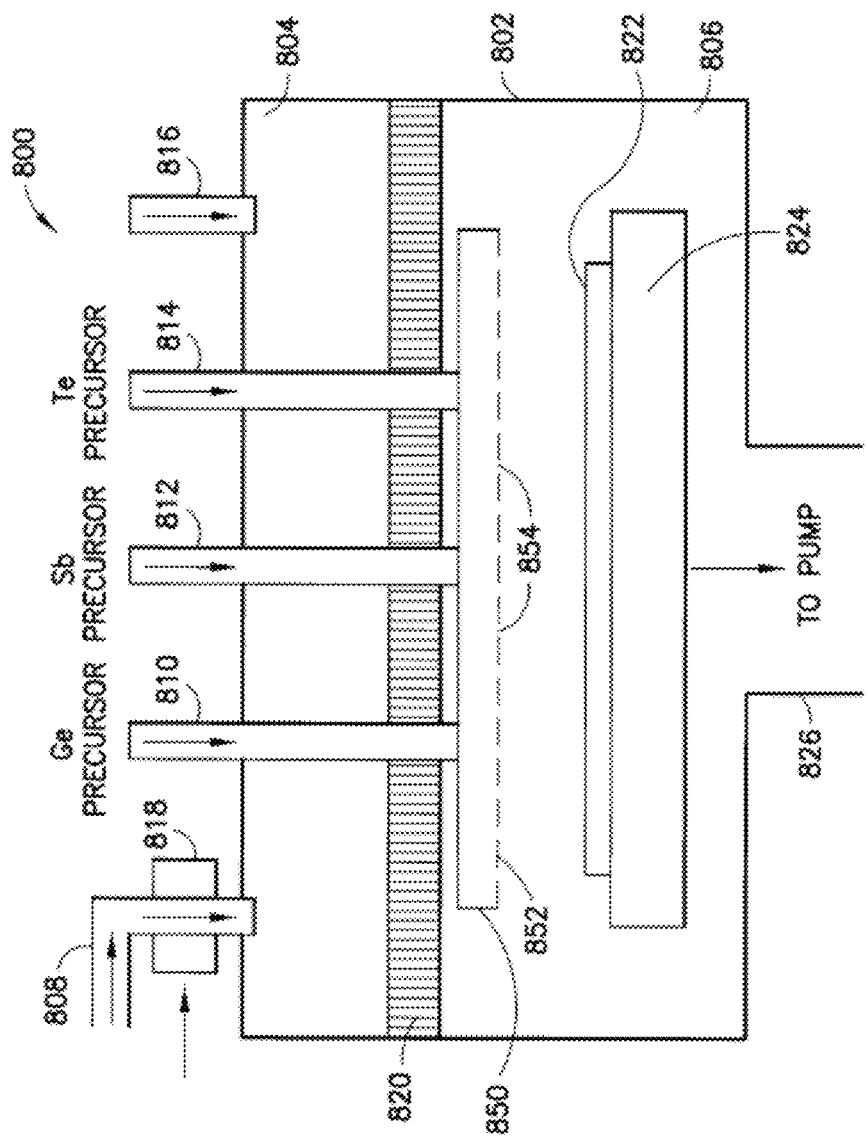
FIG. 17 is a schematic representation of another deposition system including an interlaced dual showerhead arrangement.

FIG. 17 is a schematic representation of a deposition system 800 including an interlaced dual showerhead arrangement wherein co-reactants and one or more precursors can be mixed in a first mixing portion of the deposition chamber defined by a first showerhead, with precursor inlets extending through a wall of the deposition chamber and through the first showerhead, so that the precursor inlets in flow communication with a second showerhead As illustrated, the deposition chamber 802 is equipped with multiple inlets 808, 810, 812, 814 and 816, to accommodate the introduction of the Ge, Sb and Te precursors, as well as additional precursor, coreactant, carrier and/or other material. Inlet 808 is equipped with a heater 818, and the other inlets may optionally be likewise equipped with heaters, heating elements or other components whereby heating of the introduced material is effected.

The deposition chamber 802 is partitioned by a laterally extending showerhead 820 into an upper mixing portion 804 and a lower deposition portion 806. In the lower deposition portion 806, a substrate heater 824 is mounted, with a wafer 822 thereon, oriented with its device side facing the second showerhead 850 including a discharge face 852 having multiple openings 854 therein. The deposition chamber has an outlet 826, by which effluent gas resulting from contacting of precursors can be pumped to venting, treating for abatement purposes, or processing for recovery of precursor component or components therefrom.

The second showerhead 850 is supplied by the respective inlets 810, 812 and 814, each of which passes through a wall of the deposition chamber 802 and through the first showerhead, being joined with the head structure of the showerhead as shown, so that the respective Ge, Sb and Te precursors pass into the head structure of second showerhead 850 for mixing therein and discharge of precursor vapor for downward flow in the view shown, and contact with the device side of the wafer 822.

As in the embodiment illustratively described in connection with FIG. 16, the first showerhead 820 in FIG. 17 may be formed of a sintered or otherwise porous material, e.g., of metal, ceramic, or other appropriate material, or the showerhead may be provided with vapor flow passages that are machined, laser drilled, or otherwise mechanically formed in the showerhead body, to provide suitable pressure drop and conductance characteristics for flow of material through the flow passages thereof. The first showerhead body is suitably provided with openings in which the respective inlet conduits 810, 812 and 814 are journaled or otherwise leak-tightly secured in position, e.g., with brazing, welding, or other mode of leak-type fixation.

Figure 18:
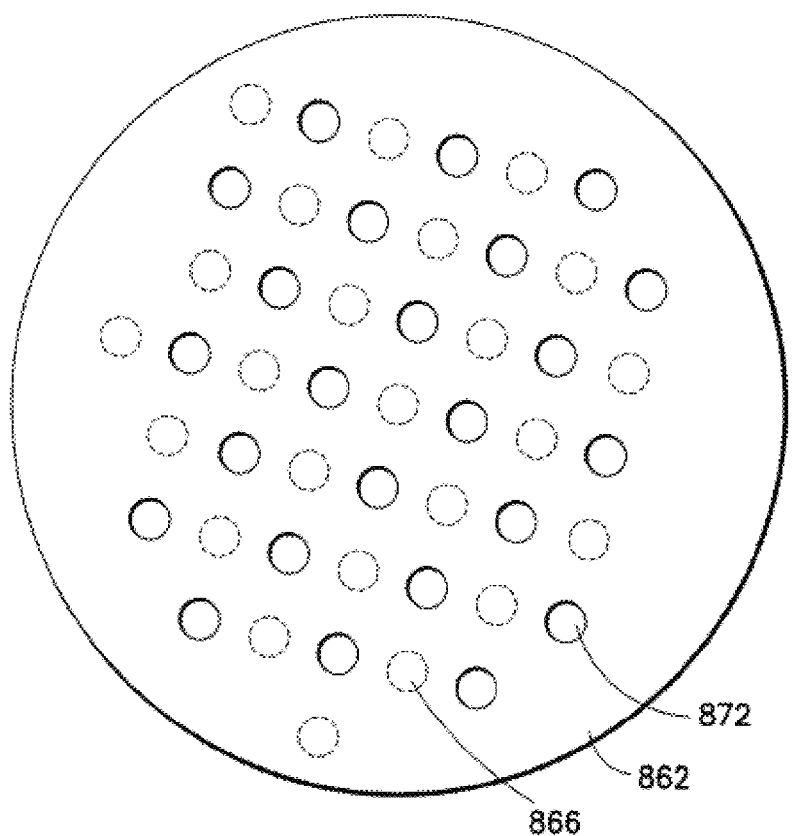
FIG. 18 is a top plan view of a showerhead body shown in partial elevation schematic view in FIG. 19, and constituting a portion of a composite showerhead assembly including two showerheads interlaced with one another, for precursor delivery.
Figure 19:
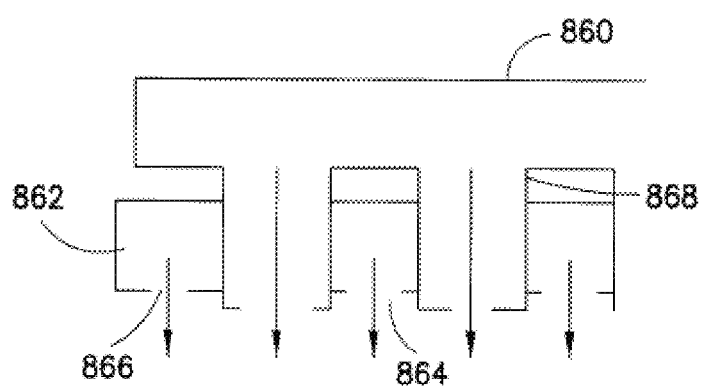

FIG. 18 is a top plan view of a showerhead body shown in partial elevation schematic view in FIG. 19, and constituting a portion of a composite showerhead assembly including two showerheads interlaced with one another, for precursor delivery.

As shown in FIG. 18, the showerhead body 862 schematically illustrated in such drawing includes openings 872 through which downwardly extending flow passages 868 of an overlying showerhead body 860 are fitted. Such downwardly extending flow passages 868 at their lower end portions define openings 864 for flow of heat-activated precursor(s) therethrough. The showerhead body 862 additionally has bottom surface openings 866, through which additional precursors are discharged from the showerhead.

It will therefore be appreciated that the showerhead bodies 860 and 862 can jointly form a composite multiple showerhead assembly that is useful for concurrent delivery of precursors or other gas/vapor components having different delivery requirements in relation to one another. Thus, a first precursor vapor component may be delivered through a first of such showerheads, while a second precursor vapor component may be delivered through a second of such showerheads. The first vapor component may be activated while the second vapor component may be non-activated, the respective vapor components may be at different temperatures, pressures, flow rates, etc., or upstream processing of such precursor components may be different from one another and require separate processing and delivery via one of the multiple showerheads.

Accordingly, the showerhead structures shown in FIGS. 16-19 provide ability to deliver multiple streams of components of the precursor vapor mixture that is contacted with the substrate on which deposition is carried out, where the separate streams require segregation from one another until their combination in the interior volume of the deposition chamber. These various showerhead structures may be usefully employed in vapor deposition of GST materials, or other materials with which individual streams are separately delivered to the deposition chamber for in situ mixing therein and contact of the mixed material with the substrate.

Such multiple showerhead arrangements permit concurrent feeding of activated and non-activated precursors to the deposition chamber to enable low process temperature to be utilized for GST film formation. For example, a tellurium precursor can be activated by heating in an inlet passage to the deposition chamber, or alternatively in a dedicated activation chamber in which the requisite heating occurs to activate the precursor. The antimony and germanium precursors would not be activated, but would be introduced with the activated tellurium precursor to the deposition portion of the deposition chamber.

As another example, both tellurium and antimony precursors may be activated and the germanium may be passed into the deposition chamber without any activation prior to entering the deposition portion of the deposition chamber.

Processes of the present disclosure enable deposition of conformal high tellurium content GST films. Specific precursors are particularly beneficial in achieving such high tellurium content. For example, di-tertiary-butyl tellurium, $(tBu)_2Te$, can be activated to form di-tertiary-butyl ditellurium, tBu-Te—Te-tBu, as a stable thermal decomposition product. Such tellurium precursor tBu-Te—Te-tBu is advantageously utilized for GST film formation with a germanium precursor such as $Ge[Pr^iNC(n-Bu)NPr^i]_2$, denoted as "GeM" for ease of notation.

More generally, such precursor tBu-Te—Te-tBu can be used for low temperature deposition of tellurium-containing films, including GST films as well as $BiTe_3$ films and cadmium telluride (CdTe) films. CVD conformality can be enhanced utilizing such tellurium precursor.

More generally, CVD conformality can be enhanced through use of low deposition temperatures, chemical modification of the precursor chemistry and modification of the CVD process parameters. The use of $(tBu)_2Te$ results in higher tellurium concentrations in the product film when higher temperature zones are used to induce pre-reaction of the precursor. Such higher temperature zones can be in close proximity to the wafer surface, but are separate and distinct regions within the CVD deposition system. By partial pyrolytic decomposition of $(tBu)_2Te$ to form tBu-Te—Te-tBu, higher tellurium content films are achievable at lower substrate temperatures. Since incorporation of tellurium can have large effects on the electrical and thermal behavior of GST films, the ability to increase tellurium content of deposited films is highly advantageous.

The use of ditelluride precursors, of the form R—Te—Te—R, wherein each R is independently selected from methyl, ethyl, propyl, isopropyl, butyl, isobutyl, tertiary butyl ($C_1$-$C_4$ alkyl) and $R'_3Si$ (trialkylsilyl) wherein each R' is independently selected from $C_1$-$C_4$ alkyl, is advantageous in producing high tellurium content films, in CVD, ALD, digital CVD and other vapor deposition processes, optionally including activation of such precursor in the deposition chamber or at the inlet to or even outside (upstream from) such chamber, be on the thermal activation occurring at the wafer surface in the deposition process. Such precursors can be used for forming GT and GST films as well as other tellurium-containing films such as CdTe photovoltaic films and thermoelectric thin films based on II-VI telluride materials.

In addition to the foregoing, the tellurium precursor used in the process of the present disclosure may be of any other suitable type or types. For example, the tellurium precursor may have the formula $TeL_n$ or cyclic $LTe(-L-)_2TeL$, wherein at least one L contains a N bonded to one said Te, "n" is between 2-6, inclusive, and each "L," is independently selected from the alkyl and aryl groups consisting of: amides of the form —$NR^1R^2$ wherein $R^1$, $R^2$ represents H, an alkyl group, or a silyl group; cyclic amides of the form —NR wherein R represents a $C_1$-$C_6$ linear, branched, cyclic, or silyl group; imido groups of the form =NR wherein R represents a $C_1$-$C_6$ linear, branched, cyclic, or silyl group; a group of the form —N(R)—, wherein the —N(R)— bridges 2 telluriums; diamides of the form —$NR^1$-A-$R^2N$— wherein $R^1$, $R^2$ and A, are, independently, a $C_1$-$C_6$ linear, branched, cyclic, or silyl group; aminoamide groups of the form —$NR^1$-A-$NR^2R^3$ wherein $R^1$, $R^2$, $R^3$ and A are, independently, a $C_1$-$C_6$ linear, branched, cyclic, or silyl group; alkoxyamide groups of the form —$NR^1$-A-$OR^2$ wherein $R^1$, $R^2$ and A are, independently, a $C_1$-$C_6$ linear, branched, cyclic, or silyl group; amidinate groups of the form —$NR^1$—$C(R^2)$—$NR^3$ wherein R', $R^2$, $R^3$ are, independently, a $C_1$-$C_6$ linear, branched, cyclic, or silyl group; and guanidinate groups of the form —$NR^1$—$C(NR^2R^3)$—$NR^4$ wherein $R^1$, $R^2$, $R^3$, $R^4$ are, independently, a $C_1$-$C_6$ linear, branched, cyclic, or silyl group.

Co-reactants may be utilized with such ditelluride precursors, including, for example, inert gases, reducing gases (hydrogen, ammonia, diborane, silane, etc.), and the like.

The ditelluride precursors first discussed above can be synthesized from the reaction of Cl—Te—Te—Cl with either RLi or Gringard reagents, wherein R is the same as previously described.

In a specific implementation, the present disclosure contemplates a vapor deposition process for depositing a GeTe-containing film on a substrate, comprising vaporizing a germanium-containing precursor and a tellurium-containing precursor to form a precursor vapor, contacting the germanium-containing precursor vapor with a substrate at a temperature that is below 250° C., and depositing on the substrate a conformal germanium-containing film. Such process may further comprise tellurium in the conformal germanium-containing film. The conformal film may be substantially amorphous. The germanium precursor may include a germanium alkyl amidinate. Other germanium precursors that may be usefully employed in forming germanium-containing films include Ge(IV) amides, Ge(IV) mixed alkyl/amide, Ge(II) amidinate, Ge(II) amide, Ge(IV) guanidinate, germylene, and Ge(II)Cp, wherein Cp is cyclopentadienyl. The tellurium precursor may comprise a di-alkyl tellurium precursor.

The substrate in the foregoing process may have temperature of from about 110° C. to about 250° C. In various embodiments of the invention, the substrate may have a temperature of from about 110° C. to about 180° C. In such process, the substrate temperature is desirably below the crystallization temperature of the multi-component germanium-containing film.

The low temperature MOCVD GST deposition process of the present disclosure has been determined to yield product GST films with equal to or better properties than those achievable by physical vapor deposition processes involving trench deposition of GST.

In the vapor deposition process, the germanium-containing film can have the composition $Ge_xSb_yTe_zA_m$, wherein A is a dopant element selected from the group of N, C, In, Sn, and Se, and wherein x is from 0.1 to 0.6, y is from 0 to 0.7, z is from 0.2 to 0.9, and m is from 0 to 0.20. In various embodiments in which antimony is present, y can be from 0.1 to 0.7. In various embodiments in which the germanium-containing film is doped, m can be from 0.01 to 0.15. As discussed elsewhere herein, the dopant A can include more than one compatible dopant element from the aforementioned group, so that $A_m$ comprises multiple $A_m$ dopant elements, wherein m for each dopant species can be from 0.01 to 0.10. In other embodiments, m can have a value of from 0.01 to 0.20. The film can be doped, for example, with both carbon and nitrogen. The carbon doping may in some embodiments provide carbon at an atomic composition of from 2 to 20 at. % carbon, in others from 3 to 20 at. %, and in still others from 2 to 15 at. %, and in yet others from 3 to 15 at. %. Such carbon doping has been found to be highly beneficial in terms of the GST film properties, particularly when carbon doping is carried out to produce greater than 1 at. % C in the GST film. Nitrogen doping has also been found to be highly beneficial, particularly at levels of at least 3 at. %, in respect of nucleation and growth rate of the film. Nitrogen doping can be carried out to provide from 1 to 20 at. % nitrogen in various embodiments, and in other embodiments from 2 to 15 at. %, and in still others from 3 to 12 at. %, and in yet others from 5 to 15 at. %.

Concerning nitrogen and carbon doping, nitrogen dopant can be introduced in the film deposition process in a nitrogen-containing germanium precursor, or other nitrogen-containing precursor utilized to form the deposited film. Alternatively, nitrogen could be introduced in the form of ammonia or other nitrogen-containing coreactant gas. Lower process temperature for the deposition process is advantageous in increasing the carbon content of the chalcogenide film. Post-deposition thermal processing of the deposited film may be carried out at sufficient temperature and for sufficient time to produce a product chalcogenide material of the desired characteristics.

The vapor deposition process itself may be of any suitable type, and may comprise chemical vapor deposition (CVD). For such purpose, the substrate may be disposed in a CVD chamber. The CVD chamber may be constructed and arranged in any suitable manner. In one embodiment, the CVD chamber includes an activation region having a first heat source. The vapor deposition process may be carried out in which at least one precursor of the germanium-containing film is activated by the first heat source. The process may further involve heating the substrate using a second heat source.

In the formation of germanium-rich GST films, doping can be carried out to improve compositional and performance properties of the film. Germanium can be doped in the GST film at levels of for example 5 to 10 atomic percent. In this manner, the 225 composition, containing 22.5% germanium, 22.5% antimony and 55% tellurium can be composition enhanced to contain from 27.5 to 32.5% germanium, with tellurium still being as high as 55%, or between 50 and 55%, with the remainder being antimony. Addition of germanium will increase crystallization temperature of the resulting alloy compared with that of the 225 composition, due to germanium doping imparting "friction" to atomic movement, and germanium's tetravalent coordinating bonding structure to tellurium being more stable than that of antimony bonding to tellurium.

As another modification of GST films, the ratio of GeTe to $Sb_2Te_3$ can be changed to alter crystallization temperature and other aspects of the materials properties of the film. GST is actually a pseudo-alloy, typically being a mix of the true alloy GeTe and $Sb_2Te_3$. The 225 composition GST film material is a mixture of two portions of GeTe and one portion of $Sb_2Te_3$. Germanium doping can be employed to increase germanium content above that of the 2:1 ratio of GeTe to $Sb_2Te_3$. The resulting alloy will reduce the tellurium content from 55% to a somewhat lower level around 50% or even slightly less, depending on the specific ratio of GeTe to $Sb_2Te_3$.

For example, a 3:1 ratio of GeTe to $Sb_2Te_3$ will be atomically $Ge_3Sb_2Te_6$, which as the atomic percentage of 27.2% germanium, 18.2% antimony and 54.5% tellurium, a 4:1 ratio of GeTe to $Sb_2Te_3$ will be atomically 30.7% germanium, 15.4% antimony, and 53.9% tellurium, a 5:1 ratio of GeTe to $Sb_2Te_3$ will be 33.3% germanium, 13.3% antimony and 53.3% tellurium, a 6:1 ratio of GeTe to $Sb_2Te_3$ will be 35.3% germanium, 11.8% antimony and 52.9% tellurium . . . and a 10:1 ratio of GeTe to $Sb_2Te_3$ will be 40% germanium, 8% antimony and 52% tellurium.

Doping the 225 composition of GST with germanium to make germanium-rich 225 will provide excess germanium in the matrix of the GeTe:$Sb_2Te_3$ mixture, beyond the ratio of m:n of such matrix alloys. Germanium-rich GST or germanium-doped 225 GST may have a ratio of GeTe:$Sb_2Te_3$ that is in a range of from 3:1 to 10:1. Specific illustrative compositions include a composition containing 27.2% germanium, 18.2% antimony and 54.5% tellurium as a first example, a composition containing 40% germanium, 8% antimony and 52% tellurium as a second example, a composition containing 30% germanium, 19% antimony and 51% tellurium as a third example, a composition containing 30% germanium, 16% antimony and 54% tellurium as a fourth example, and a composition containing 32% germanium, 14% antimony and 54% tellurium as a fifth example. More generally, germanium-rich GST or germanium self-doped 225 GST provides superior film properties, and includes GST alloys having from 27 to 33% germanium, from 14 to 23% antimony and from 50 to 55% tellurium. The invention also contemplates GST compositions having from 55 to 60 at. % tellurium, in specific embodiments.

Doping of GST films with dopants other than Ge, Sb or Te is contemplated by the present disclosure. Any suitable dopant species may be employed that improve the properties of the GST film for its intended purpose. For example, the GST films may be doped with carbon and/or nitrogen to improve film properties, e.g., to significantly reduce reset current of the film in a phase change memory applications. For such purpose, nitrogen doping at atomic percentages of from 4 to 10% or more, and carbon doping at atomic percentages of from 2 to 6% or more, can be employed.

In various applications, the present disclosure contemplates conformal GST thin films having an atomic composition comprising from 10 to 50% Sb, from 50 to 80% Te, from 10 to 50% Ge, from 0 to 10% N and from 0 to 5% carbon, and wherein all atomic percentages of all components of the film total to 100 atomic %. Such films may be formed using CVD, e.g., in a low temperature CVD process as described herein.

Additional illustrative GST film compositions include compositions in which ratios of germanium (Ge) to antimony (Sb) to tellurium (Te) (atomic % (at. %)) may be about 2:2:5, about 4:1:5, about 30:15:55, or the like. In embodiments in which the ratio is 2:2:5, Ge is about 20-25 at. %, Sb is about 20-25 at. %, and Te is about 50-60 at. %. In embodiments in which the ratio is 4:1:5, Ge is about 40-45 at. %, Sb is about 5-10 at. %, and Te is about 50-55 at. %. In embodiments in which the ratio is 30:15:55, Ge is about 27-33 at. %, Sb is about 15-20 at. %, and Te is about 50-60 at. %. A further illustrative GST film composition contains from about 25 to 35% germanium, from about 15 225% antimony, and from about 45 to 55% tellurium. Another illustrative GST film composition contains from about 35 to 45% germanium, from about 1 to 10% antimony, and from about 45 to 55% tellurium. A still further illustrative film composition contains from about 75% to about 85% germanium, from about 5 to about 15% antimony, and from about 5 to about 15% tellurium. Another illustrative GST film composition contains from 27 to 33% germanium, from 45 to 55% tellurium, and the balance being antimony. In general, it is possible to add carbon up to 10 atomic percent, e.g., 3%, and to add nitrogen up to 15 atomic percent, e.g., 5%.

Although the foregoing disclosure has been directed principally to GST films, the present disclosure further contemplates GT films, of the formula $Ge_xTe_zA_m$ wherein A and m are as previously defined. In such formula, x can be from 0.32 to 0.60, and y can be from 0.40 to 0.68, in some embodiments. In other embodiments, x can be from 0.30 to 0.70, and y can be from 0.30 to 0.70.

Thus, the present disclosure contemplates GST and GT films of varied composition, e.g., GST films doped with carbon, GST films doped with nitrogen, GST films doped with carbon and nitrogen, etc.

Low temperature processes of the present disclosure are usefully employed for MOCVD conformal deposition of GST in high aspect ratio trenches and holes.

Figure 15A:
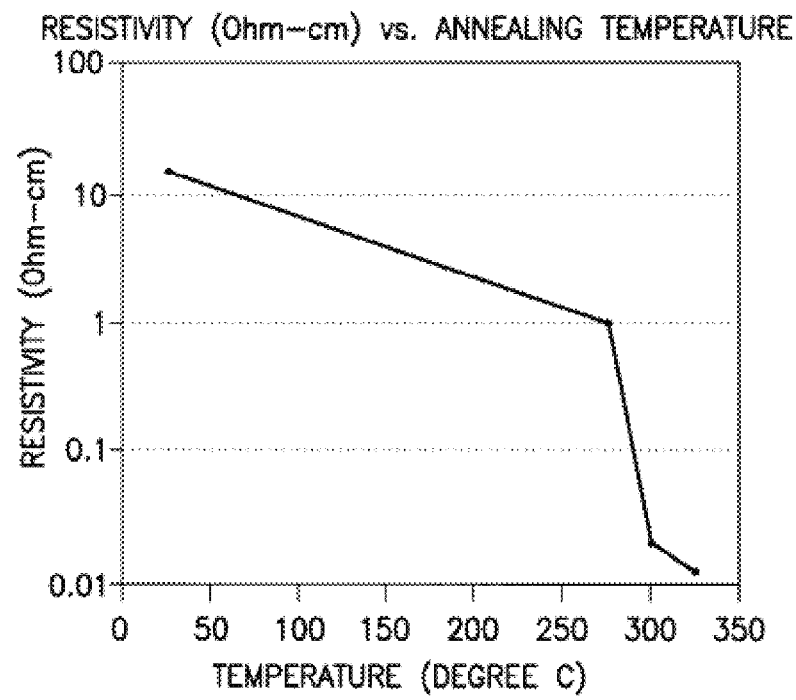
FIG. 15a is a graphical representation of the resistivity of GST film after annealing.
Figure 15B:
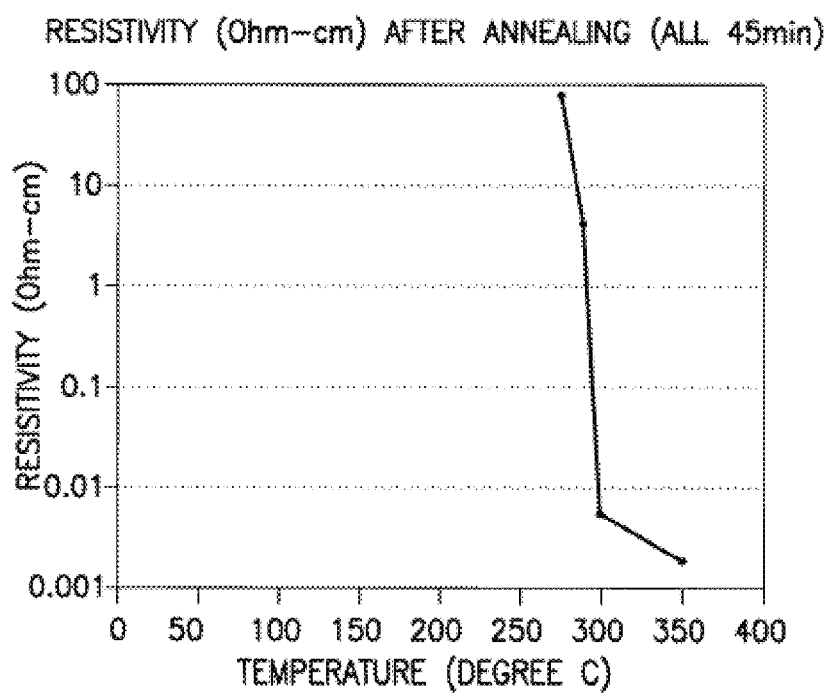
FIG. 15b is a graphical representation of the resistivity of GST film after annealing.

The new processes and new systems described herein have several advantages. First, deposition of the GST materials using heat (e.g., at about 200 degrees C. to 450 degrees C.) facilitates the reactivity of the Ge, Sb, and Te by increasing the reactivity thereof. Such an increase in reactivity means that GST can be deposited on a substrate at a lower temperature (e.g., at about 110 degrees C. to 250 degrees C.), yet achieving high percentages of Te. Second, the process can be a batch process in which any number of substrates can be processed in a similar configuration just by simply duplicating the process for additional substrates. Third, as can be seen in FIGS. 15a and 15b, processing of a substrate using the processes and systems described herein produce low resistivity films (high conductivity films) after annealing up to about 300 degrees C. Also, as is shown in Table 4, the nitrogen content of a GST film is markedly reduced after annealing.

While the disclosure has been primarily directed to chemical vapor deposition as the deposition methodology for deposit of GST materials and films, it is to be appreciated that the invention is amenable to utilization of other vapor deposition techniques. For example, atomic layer deposition may be usefully employed within the broad scope of the present disclosure, to effect deposition of GST materials and films. For this purpose, the ALD vapor deposition process that is used to deposit the GST material can be carried out in any suitable manner to produce product GST films, within the skill of the art, based on the disclosure herein. For example, ALD process parameters, e.g., pulse times, cycle durations, temperatures, pressures, volumetric flow rates, etc. can be determined by simple successive empirical runs in which process parameters are selectively varied to determine the best multivariable process envelope for conducting the ALD vapor deposition process.

The low temperature process of the present disclosure can employ the activation techniques and arrangements herein disclosed in processes wherein selected one(s) of the precursors are activated while other precursors are not activated. The selection of a specific activation scheme and arrangement for effecting same can readily be made, within the skill of the art, based on the disclosure hereof. In specific arrangements, showerhead devices can be employed to constitute the activation region and to facilitate precursor delivery.

While the disclosure has been directed primarily to GST materials and films, the disclosure also contemplates the formation of other materials and films such as GT as well as $BiTe_3$ and cadmium telluride (CdTe) materials and films, utilizing precursors and deposition processes herein described. It will be appreciated that the phase change material of the present disclosure can be provided in thin film and other conformations, and can be utilized in a variety of microelectronic device applications.

In addition, it will be appreciated that the chemical species employed to deposit the chalcogenide material may be thermally activated or in other manner energized to generate transitory species for the deposition. By this approach, a chemical species may be transformed into a different chemical form to provide deposition species that may for example be short-lived but are sufficiently present to enable deposition, in the transport from the activation region to the wafer surface. In this manner, a deposition chemical species may be generated in situ for the deposition operation.

With respect to the carbon and nitrogen species that are incorporated in the GST film in various embodiments of the disclosure, it will be recognized that these species may be provided in a bound or non-bound form. For example, the nitrogen as mentioned may be introduced in free form as nitrogen gas, or alternatively as a nitrogen-containing moiety in a precursor or coreactant that is introduced to the deposition operation.

Further, lower deposition temperatures are beneficial from the perspective of maintaining the amorphous character of the deposited chalcogenide film, and enabling higher levels of carbon to be incorporated in the growing film, thereby providing beneficial nucleation sites favoring more rapid growth of the chalcogenide film, in addition to reducing capital and operating costs associated with the deposition system. In this respect, the nucleation sites present in the film may derive from the presence of carbon as well as nitrogen, and may also be generated as a result of carbon-nitrogen interaction. In general, the more nucleation sites present in the chalcogenide film, the faster nucleation will take place and the more rapid will be the transformation between amorphous and crystalline states in the operation of the GST material. Broadly, the greater the population of nucleation sites, the shorter are the required crystalline lengths involved in the propagation of crystalline transformation, and the quicker the GST device will be in response to a phase change stimulus.

INDUSTRIAL APPLICABILITY

The germanium-antimony-tellurium (GST) alloy films produced by the processes herein disclosed are usefully employed in phase change memory devices, including NOR flash memory, dynamic random access memory (DRAM) and storage class memory (SCM), taking advantage of the properties of such chalcogenide alloy, which can be readily switched between crystalline (binary 1) and amorphous (binary 0) states, or in some applications, between amorphous, crystalline and two additional partially crystalline states.

The invention claimed is:

1. A process for forming a germanium telluride material on a substrate, comprising vaporizing germanium and tellurium precursors, to form corresponding precursor vapor; heating the tellurium precursor vapor to temperature sufficient for activation thereof, separate from the germanium precursor; contacting the germanium precursor vapor and activated tellurium precursor vapor with the substrate under conditions enabling formation of said germanium telluride material on the substrate, wherein the germanium telluride material comprises material of the formula $Ge_xTe_zA_m$, wherein A comprises one or more elements selected from the group consisting of N, C, In, Sn, and Se, and wherein x is from 0.1 to 0.6, z is from 0.2 to 0.9, and m is from 0 to 0.15.

2. The process of claim 1, wherein the substrate during said contacting is at temperature below the crystallization temperature of said germanium telluride material.

3. The process of claim 1, wherein the substrate during said contacting is at temperature in a range of from 110° C. to 300° C.

4. The process of claim 1, wherein the tellurium precursor vapor is heated in said heating to temperature in a range of from 180° C. to 450° C. for activation thereof.

5. The process of claim 1, wherein the germanium precursor comprises a precursor selected from the group consisting of Ge(IV) amides, Ge(IV) mixed alkyl/amides, Ge(II) amidinates, Ge(II) amides, Ge(IV) guanidinates, germylenes, and Ge(II)Cp, wherein Cp is cyclopentadienyl.

6. The process of claim 1, wherein the germanium precursor comprises $Ge[Pr^iNC(n-Bu)NPr^i]_2$.

7. A process for forming a germanium telluride material on a substrate, comprising vaporizing germanium and tellurium precursors, to form corresponding precursor vapor; heating the tellurium precursor vapor to temperature sufficient for activation thereof, separate from the germanium precursor;

contacting the germanium precursor vapor and activated tellurium precursor vapor with the substrate under conditions enabling formation of said germanium telluride material on the substrate, wherein the tellurium precursor comprises a precursor of the formula $TeL_n$ or cyclic $LTe(-L-)_2TeL$, wherein at least one L contains a N bonded to one said Te, n is between 2-6, inclusive, and each L is independently selected from the alkyl and aryl groups consisting of: amides of the form —$NR^1R^2$ wherein $R^1$, $R^2$ represents H, an alkyl group, or a silyl group; cyclic amides of the form —NR wherein R represents a $C_1$-$C_6$ linear, branched, cyclic, or silyl group; imido groups of the form =NR wherein R represents a $C_1$-$C_6$ linear, branched, cyclic, or silyl group; a group of the form —N(R)—, wherein the —N(R)— bridges 2 telluriums; diamides of the form —$NR^1$-A-$R^2N$— wherein $R^1$, $R^2$ and A, are, independently, a $C_1$-$C_6$ linear, branched, cyclic, or silyl group; aminoamide groups of the form —$NR^1$-A-$NR^2R^3$ wherein $R^1$, $R^2$, $R^3$ and A are, independently, a $C_1$-$C_6$ linear, branched, cyclic, or silyl group; alkoxyamide groups of the form —$NR^1$-A-$OR^2$ wherein $R^1$, $R^2$ and A are, independently, a $C_1$-$C_6$ linear, branched, cyclic, or silyl group; amidinate groups of the form —$NR^1$—$C(R^2)$—$NR^3$ wherein $R^1$, $R^2$, $R^3$ are, independently, a $C_1$-$C_6$ linear, branched, cyclic, or silyl group; and guanidinate groups of the form —$NR^1$—$C(NR^2R^3)$—$NR^4$ wherein $R^1$, $R^2$, $R^3$, $R^4$ are, independently, a $C_1$-$C_6$ linear, branched, cyclic, or silyl group.

* * * * *